United States Patent
Bots et al.

(10) Patent No.: US 9,621,666 B2
(45) Date of Patent: Apr. 11, 2017

(54) SYSTEMS AND METHODS FOR ENHANCED DELTA COMPRESSION

(71) Applicant: Citrix Systems, Inc., Fort Lauderdale, FL (US)

(72) Inventors: Henk Bots, Santa Clara, CA (US); Srikanth Devarajan, Santa Clara, CA (US); Saravana Annamalaisami, Santa Clara, CA (US); Nicholas Stavrakos, Mountain View, CA (US); Jeff Monks, Sunnyvale, CA (US); Fred Koopmans, Menlo Park, CA (US); Chris Koopmans, Sunnyvale, CA (US); Kapil Dakhane, Sunnyvale, CA (US)

(73) Assignee: CITRIX SYSTEMS, INC., Fort Lauderdale, FL (US)

( * ) Notice: Subject to any disclaimer, the term of this patent is extended or adjusted under 35 U.S.C. 154(b) by 118 days.

(21) Appl. No.: 14/448,642

(22) Filed: Jul. 31, 2014

(65) Prior Publication Data
US 2015/0026567 A1 Jan. 22, 2015

Related U.S. Application Data

(63) Continuation-in-part of application No. 11/439,003, filed on May 22, 2006, now Pat. No. 8,856,279, and
(Continued)

(51) Int. Cl.
*G06F 15/16* (2006.01)
*H04L 29/08* (2006.01)
(Continued)

(52) U.S. Cl.
CPC .... *H04L 67/2828* (2013.01); *G06F 17/30902* (2013.01); *H03M 7/30* (2013.01);
(Continued)

(58) Field of Classification Search
USPC ......... 709/203–218; 707/640–694, 741–798, 707/200–203; 715/242–511
See application file for complete search history.

(56) References Cited

U.S. PATENT DOCUMENTS 5,867,494 A   2/1999   Krishnaswamy et al.
5,905,492 A   5/1999   Straub et al.
(Continued)

FOREIGN PATENT DOCUMENTS

CN   1478348 A      2/2004
EP   1 422 907 A2   5/2004
(Continued)

OTHER PUBLICATIONS

Advisory Action for U.S. Appl. No. 11/465,894 dated Mar. 10, 2010.
(Continued)

*Primary Examiner* — Man Phan
(74) *Attorney, Agent, or Firm* — Foley & Lardner LLP; Christopher J. McKenna; Shabbi S. Khan

(57) ABSTRACT

Systems and methods for reducing file sizes for files delivered over a network are disclosed. A method comprises receiving a first file comprising sequences of data; creating a hash table having entries corresponding to overlapping sequences of data; receiving a second file comprising sequences of data; comparing each of the sequences of data in the second file to the sequences of data in the hash table to determine sequences of data present in both the first and second files; and creating a third file comprising sequences of data from the second file and representations of locations and lengths of said sequences of data present in both the first and second files.

20 Claims, 21 Drawing Sheets

Related U.S. Application Data a continuation-in-part of application No. 12/790,400, filed on May 28, 2010, now Pat. No. 8,838,630, which is a continuation of application No. 11/428,058, filed on Jun. 30, 2006, now Pat. No. 7,756,826.

(60) Provisional application No. 60/685,260, filed on May 26, 2005.

(51) Int. Cl.
  *G06F 17/30* (2006.01)
  *H03M 7/30* (2006.01)
  *H04W 80/06* (2009.01)
  *H04W 8/24* (2009.01)

(52) U.S. Cl.
  CPC .............. *H04L 67/02* (2013.01); *H04L 67/06* (2013.01); *H04L 67/2852* (2013.01); *H04W 80/06* (2013.01); *H04W 8/245* (2013.01)

(56) References Cited

U.S. PATENT DOCUMENTS

| | | |
|---|---|---|
| 5,909,559 A | 6/1999 | So |
| 5,999,525 A | 12/1999 | Krishnaswamy et al. |
| 6,011,537 A | 1/2000 | Slotznick |
| 6,022,315 A | 2/2000 | Iliff |
| 6,085,224 A | 7/2000 | Wagner |
| 6,130,726 A | 10/2000 | Darbee et al. |
| 6,141,699 A | 10/2000 | Luzzi et al. |
| 6,161,139 A | 12/2000 | Win et al. |
| 6,161,760 A | 12/2000 | Marrs et al. |
| 6,167,441 A | 12/2000 | Himmel |
| 6,182,139 B1 | 1/2001 | Brendel |
| 6,182,142 B1 | 1/2001 | Win et al. |
| 6,185,625 B1 | 2/2001 | Tso et al. |
| 6,206,829 B1 | 3/2001 | Iliff |
| 6,289,382 B1 | 9/2001 | Bowman-Amuah |
| 6,292,792 B1 | 9/2001 | Baffes et al. |
| 6,308,273 B1 | 10/2001 | Goertzel et al. |
| 6,314,094 B1 | 11/2001 | Boys |
| 6,321,235 B1 | 11/2001 | Bird |
| 6,332,163 B1 | 12/2001 | Bowman-Amuah |
| 6,335,927 B1 | 1/2002 | Elliott et al. |
| 6,339,832 B1 | 1/2002 | Bowman-Amuah |
| 6,424,979 B1 | 7/2002 | Livingston et al. |
| 6,434,568 B1 | 8/2002 | Bowman-Amuah |
| 6,434,628 B1 | 8/2002 | Bowman-Amuah |
| 6,438,594 B1 | 8/2002 | Bowman-Amuah |
| 6,442,748 B1 | 8/2002 | Bowman-Amuah |
| 6,449,627 B1 | 9/2002 | Baer et al. |
| 6,449,658 B1 | 9/2002 | Lafe et al. |
| 6,473,794 B1 | 10/2002 | Guheen et al. |
| 6,477,580 B1 | 11/2002 | Bowman-Amuah |
| 6,477,665 B1 | 11/2002 | Bowman-Amuah |
| 6,482,156 B2 | 11/2002 | Iliff |
| 6,490,624 B1 | 12/2002 | Sampson et al. |
| 6,496,850 B1 | 12/2002 | Bowman-Amuah |
| 6,502,102 B1 | 12/2002 | Haswell et al. |
| 6,502,213 B1 | 12/2002 | Bowman-Amuah |
| 6,516,322 B1 | 2/2003 | Meredith |
| 6,519,571 B1 | 2/2003 | Guheen et al. |
| 6,523,027 B1 | 2/2003 | Underwood |
| 6,529,909 B1 | 3/2003 | Bowman-Amuah |
| 6,529,948 B1 | 3/2003 | Bowman-Amuah |
| 6,536,037 B1 | 3/2003 | Guheen et al. |
| 6,539,396 B1 | 3/2003 | Bowman-Amuah |
| 6,549,949 B1 | 4/2003 | Bowman-Amuah |
| 6,550,012 B1 | 4/2003 | Villa et al. |
| 6,550,057 B1 | 4/2003 | Bowman-Amuah |
| 6,563,517 B1 | 5/2003 | Bhagwat et al. |
| 6,571,282 B1 | 5/2003 | Bowman-Amuah |
| 6,578,068 B1 | 6/2003 | Bowman-Amuah |
| 6,578,073 B1 | 6/2003 | Starnes et al. |
| 6,584,567 B1 | 6/2003 | Bellwood et al. |
| 6,584,569 B2 | 6/2003 | Reshef et al. |
| 6,587,880 B1 | 7/2003 | Saigo et al. |
| 6,591,266 B1 | 7/2003 | Li et al. |
| 6,601,192 B1 | 7/2003 | Bowman-Amuah |
| 6,601,233 B1 | 7/2003 | Underwood |
| 6,601,234 B1 | 7/2003 | Bowman-Amuah |
| 6,606,660 B1 | 8/2003 | Bowman-Amuah |
| 6,609,128 B1 | 8/2003 | Underwood |
| 6,611,840 B1 | 8/2003 | Baer et al. |
| 6,615,166 B1 | 9/2003 | Guheen et al. |
| 6,615,199 B1 | 9/2003 | Bowman-Amuah |
| 6,615,253 B1 | 9/2003 | Bowman-Amuah |
| 6,625,643 B1 | 9/2003 | Colby et al. |
| 6,633,878 B1 | 10/2003 | Underwood |
| 6,636,242 B2 | 10/2003 | Bowman-Amuah |
| 6,640,238 B1 | 10/2003 | Bowman-Amuah |
| 6,640,240 B1 | 10/2003 | Hoffman et al. |
| 6,640,244 B1 | 10/2003 | Bowman-Amuah |
| 6,640,249 B1 | 10/2003 | Bowman-Amuah |
| 6,658,464 B2 | 12/2003 | Reisman |
| 6,680,922 B1 | 1/2004 | Jorgensen |
| 6,691,301 B2 | 2/2004 | Bowen |
| 6,701,514 B1 | 3/2004 | Haswell et al. |
| 6,704,738 B1 | 3/2004 | De Vries et al. |
| 6,704,873 B1 | 3/2004 | Underwood |
| 6,715,145 B1 | 3/2004 | Bowman-Amuah |
| 6,718,535 B1 | 4/2004 | Underwood |
| 6,721,713 B1 | 4/2004 | Guheen et al. |
| 6,731,625 B1 | 5/2004 | Eastep et al. |
| 6,742,015 B1 | 5/2004 | Bowman-Amuah |
| 6,754,181 B1 | 6/2004 | Elliott et al. |
| 6,754,699 B2 | 6/2004 | Swildens et al. |
| 6,771,290 B1 | 8/2004 | Hoyle |
| 6,772,203 B1 | 8/2004 | Feiertag et al. |
| 6,792,458 B1 | 9/2004 | Muret et al. |
| 6,804,701 B2 | 10/2004 | Muret et al. |
| 6,807,277 B1 | 10/2004 | Doonan et al. |
| 6,816,872 B1 * | 11/2004 | Squibb .............. G06F 17/30067 |
| 6,823,374 B2 | 11/2004 | Kausik et al. |
| 6,826,594 B1 | 11/2004 | Pettersen |
| 6,826,696 B1 | 11/2004 | Chawla et al. |
| 6,839,701 B1 | 1/2005 | Baer et al. |
| 6,842,906 B1 | 1/2005 | Bowman-Amuah |
| 6,847,983 B2 | 1/2005 | Somalwar et al. |
| 6,849,045 B2 | 2/2005 | Iliff |
| 6,859,879 B2 | 2/2005 | Henn et al. |
| 6,868,292 B2 | 3/2005 | Ficco et al. |
| 6,895,084 B1 | 5/2005 | Saylor et al. |
| 6,907,546 B1 | 6/2005 | Haswell et al. |
| 6,909,708 B1 | 6/2005 | Krishnaswamy et al. |
| 6,920,150 B1 | 7/2005 | Pauls et al. |
| 6,925,467 B2 | 8/2005 | Gu et al. |
| 6,956,858 B2 | 10/2005 | Hariguchi et al. |
| 6,957,186 B1 | 10/2005 | Guheen et al. |
| 6,963,981 B1 | 11/2005 | Bailey et al. |
| 6,976,090 B2 | 12/2005 | Ben-Shaul et al. |
| 6,980,962 B1 | 12/2005 | Arganbright et al. |
| 6,981,180 B1 | 12/2005 | Bailey et al. |
| 6,983,331 B1 | 1/2006 | Mitchell et al. |
| 6,986,102 B1 | 1/2006 | Baer et al. |
| 6,987,987 B1 | 1/2006 | Vacanti et al. |
| 6,993,004 B2 | 1/2006 | Boys |
| 7,007,034 B1 | 2/2006 | Hartman et al. |
| 7,007,064 B2 | 2/2006 | Faris |
| 7,034,691 B1 | 4/2006 | Rapaport et al. |
| 7,035,907 B1 | 4/2006 | Decasper et al. |
| 7,043,488 B1 | 5/2006 | Baer et al. |
| 7,047,281 B1 | 5/2006 | Kausik |
| 7,054,912 B2 | 5/2006 | Kanai et al. |
| 7,058,180 B2 | 6/2006 | Ferchichi et al. |
| 7,058,718 B2 | 6/2006 | Fontes et al. |
| 7,076,486 B2 | 7/2006 | Livshits |
| 7,076,494 B1 | 7/2006 | Baer et al. |
| 7,080,041 B2 | 7/2006 | Nagel |
| 7,085,834 B2 | 8/2006 | Delany et al. |
| 7,089,239 B1 | 8/2006 | Baer et al. |
| 7,092,370 B2 | 8/2006 | Jiang et al. |
| 7,093,018 B1 | 8/2006 | Sievers et al. |
| 7,096,495 B1 | 8/2006 | Warrier et al. |

(56) References Cited

U.S. PATENT DOCUMENTS

| | | | |
|---|---|---|---|
| 7,100,049 B2 * | 8/2006 | Gasparini | G06F 21/31 713/170 |
| 7,100,195 B1 | 8/2006 | Underwood | |
| 7,103,772 B2 | 9/2006 | Jorgensen et al. | |
| 7,107,285 B2 | 9/2006 | Von Kaenel et al. | |
| 7,107,309 B1 | 9/2006 | Geddes et al. | |
| 7,117,504 B2 | 10/2006 | Smith et al. | |
| 7,127,713 B2 | 10/2006 | Davis et al. | |
| 7,145,898 B1 | 12/2006 | Elliott | |
| 7,149,698 B2 | 12/2006 | Guheen et al. | |
| 7,152,047 B1 | 12/2006 | Nagel | |
| 7,165,041 B1 | 1/2007 | Guheen et al. | |
| 7,174,563 B1 | 2/2007 | Brownlie et al. | |
| 7,188,216 B1 | 3/2007 | Rajkumar et al. | |
| 7,197,762 B2 | 3/2007 | Tarquini | |
| 7,203,722 B2 | 4/2007 | Elnozahy | |
| 7,209,466 B2 | 4/2007 | Cabana | |
| 7,216,713 B2 | 5/2007 | Read, Jr. | |
| 7,222,137 B2 | 5/2007 | Terazono et al. | |
| 7,320,009 B1 | 1/2008 | Srivastava et al. | |
| 7,353,225 B2 | 4/2008 | Dada | |
| 7,359,956 B2 | 4/2008 | Kanai et al. | |
| 7,360,025 B1 | 4/2008 | O'Connell et al. | |
| 7,366,824 B2 | 4/2008 | Chiang | |
| 7,389,540 B2 | 6/2008 | Radatti et al. | |
| 7,392,260 B2 | 6/2008 | Ren et al. | |
| 7,437,457 B1 | 10/2008 | Eisendrath et al. | |
| 7,441,119 B2 | 10/2008 | Brabson et al. | |
| 7,464,332 B2 | 12/2008 | Carter, II | |
| 7,512,702 B1 | 3/2009 | Srivastava et al. | |
| 7,529,779 B2 | 5/2009 | Herle et al. | |
| 7,565,450 B2 | 7/2009 | Garcia-Luna-Aceves et al. | |
| 7,577,749 B1 | 8/2009 | Long | |
| 7,616,597 B2 | 11/2009 | Liu et al. | |
| 7,634,800 B2 | 12/2009 | Ide et al. | |
| 7,698,318 B2 | 4/2010 | Fries et al. | |
| 7,698,416 B2 | 4/2010 | Potti et al. | |
| 7,711,706 B2 | 5/2010 | Manapetty et al. | |
| 7,730,031 B2 | 6/2010 | Forster | |
| 7,743,063 B2 | 6/2010 | James et al. | |
| 7,797,406 B2 | 9/2010 | Patel et al. | |
| 7,881,995 B2 | 2/2011 | Grimberg | |
| 7,890,464 B2 | 2/2011 | Reinsch | |
| 7,890,634 B2 * | 2/2011 | Jiang | H04L 9/0825 709/214 |
| 7,941,410 B2 | 5/2011 | Sagar et al. | |
| 7,970,806 B2 | 6/2011 | Park et al. | |
| 8,024,778 B2 | 9/2011 | Cash et al. | |
| 8,136,149 B2 | 3/2012 | Freund | |
| 8,156,071 B2 | 4/2012 | Gu et al. | |
| 8,234,699 B2 | 7/2012 | Pollutro et al. | |
| 8,285,681 B2 * | 10/2012 | Prahlad | G06F 17/3002 707/640 |
| 8,307,177 B2 * | 11/2012 | Prahlad | G06F 11/1453 711/162 |
| 8,776,166 B1 | 7/2014 | Erickson et al. | |
| 8,849,761 B2 * | 9/2014 | Prahlad | G06F 17/3002 707/640 |
| 2001/0019630 A1 | 9/2001 | Johnson | |
| 2002/0010855 A1 | 1/2002 | Reshef et al. | |
| 2002/0042821 A1 | 4/2002 | Muret et al. | |
| 2002/0049608 A1 | 4/2002 | Hartsell et al. | |
| 2002/0049841 A1 | 4/2002 | Johnson et al. | |
| 2002/0059274 A1 | 5/2002 | Hartsell et al. | |
| 2002/0065864 A1 | 5/2002 | Hartsell et al. | |
| 2002/0065911 A1 | 5/2002 | Von Klopp et al. | |
| 2002/0083175 A1 | 6/2002 | Afek et al. | |
| 2002/0116642 A1 | 8/2002 | Joshi et al. | |
| 2002/0129271 A1 | 9/2002 | Stanaway et al. | |
| 2002/0133723 A1 | 9/2002 | Tait | |
| 2002/0138572 A1 | 9/2002 | Delany et al. | |
| 2002/0143798 A1 | 10/2002 | Lisiecki et al. | |
| 2002/0143888 A1 | 10/2002 | Lisiecki et al. | |
| 2002/0147774 A1 | 10/2002 | Lisiecki et al. | |
| 2002/0147927 A1 | 10/2002 | Tait | |
| 2002/0161904 A1 | 10/2002 | Tredoux et al. | |
| 2002/0165971 A1 | 11/2002 | Baron | |
| 2002/0174227 A1 | 11/2002 | Hartsell et al. | |
| 2002/0178211 A1 | 11/2002 | Singhal et al. | |
| 2003/0014623 A1 | 1/2003 | Freed et al. | |
| 2003/0014628 A1 | 1/2003 | Freed et al. | |
| 2003/0037108 A1 | 2/2003 | Peiffer et al. | |
| 2003/0041091 A1 | 2/2003 | Cheline et al. | |
| 2003/0051142 A1 | 3/2003 | Hidalgo et al. | |
| 2003/0056096 A1 | 3/2003 | Albert et al. | |
| 2003/0065763 A1 | 4/2003 | Swildens et al. | |
| 2003/0069803 A1 | 4/2003 | Pollitt | |
| 2003/0105957 A1 | 6/2003 | Brabson et al. | |
| 2003/0154239 A1 | 8/2003 | Davis et al. | |
| 2003/0182423 A1 | 9/2003 | Shafir et al. | |
| 2003/0212771 A1 | 11/2003 | Kwon et al. | |
| 2003/0217149 A1 | 11/2003 | Crichton et al. | |
| 2003/0233581 A1 | 12/2003 | Reshef et al. | |
| 2004/0006643 A1 | 1/2004 | Dolson et al. | |
| 2004/0006739 A1 | 1/2004 | Mulligan | |
| 2004/0010621 A1 | 1/2004 | Afergan et al. | |
| 2004/0031058 A1 | 2/2004 | Reisman | |
| 2004/0039827 A1 | 2/2004 | Thomas et al. | |
| 2004/0073701 A1 | 4/2004 | Huang et al. | |
| 2004/0122951 A1 | 6/2004 | Beck et al. | |
| 2004/0168083 A1 | 8/2004 | Gasparini et al. | |
| 2004/0177247 A1 | 9/2004 | Peles | |
| 2004/0249970 A1 | 12/2004 | Castro et al. | |
| 2004/0255048 A1 | 12/2004 | Lev Ran et al. | |
| 2005/0004954 A1 * | 1/2005 | Soule | G06F 17/30286 |
| 2005/0015429 A1 | 1/2005 | Ashley et al. | |
| 2005/0015594 A1 | 1/2005 | Ashley et al. | |
| 2005/0033858 A1 | 2/2005 | Swildens et al. | |
| 2005/0039190 A1 | 2/2005 | Rees et al. | |
| 2005/0044089 A1 | 2/2005 | Wu et al. | |
| 2005/0050053 A1 | 3/2005 | Thompson | |
| 2005/0055577 A1 | 3/2005 | Wesemann et al. | |
| 2005/0097598 A1 | 5/2005 | Pedlow et al. | |
| 2005/0108710 A1 | 5/2005 | Patiejunas | |
| 2005/0122980 A1 | 6/2005 | Anand et al. | |
| 2005/0132030 A1 | 6/2005 | Hopen et al. | |
| 2005/0132060 A1 | 6/2005 | Mo et al. | |
| 2005/0165889 A1 | 7/2005 | Muret et al. | |
| 2005/0198380 A1 | 9/2005 | Panasyuk et al. | |
| 2005/0210263 A1 | 9/2005 | Levas et al. | |
| 2005/0251856 A1 | 11/2005 | Araujo et al. | |
| 2005/0273849 A1 | 12/2005 | Araujo et al. | |
| 2005/0273850 A1 | 12/2005 | Freund | |
| 2006/0020807 A1 | 1/2006 | Aura et al. | |
| 2006/0041635 A1 | 2/2006 | Alexander et al. | |
| 2006/0047974 A1 | 3/2006 | Alpern et al. | |
| 2006/0068755 A1 | 3/2006 | Shraim et al. | |
| 2006/0069926 A1 | 3/2006 | Ginter et al. | |
| 2006/0075464 A1 | 4/2006 | Golan et al. | |
| 2006/0080432 A1 | 4/2006 | Spataro et al. | |
| 2006/0085850 A1 | 4/2006 | Mayfield et al. | |
| 2006/0106888 A1 | 5/2006 | Iida et al. | |
| 2006/0112174 A1 | 5/2006 | L'Heureux et al. | |
| 2006/0130046 A1 | 6/2006 | O'Neill | |
| 2006/0143702 A1 | 6/2006 | Hisada et al. | |
| 2006/0212706 A1 | 9/2006 | Jiang et al. | |
| 2006/0271705 A1 | 11/2006 | Garcia-Luna-Aceves | |
| 2007/0005777 A1 | 1/2007 | Fremantle et al. | |
| 2007/0106681 A1 | 5/2007 | Haot et al. | |
| 2007/0156852 A1 | 7/2007 | Sundarrajan et al. | |
| 2007/0179955 A1 | 8/2007 | Croft et al. | |
| 2007/0180088 A1 | 8/2007 | Zhao | |
| 2007/0192853 A1 | 8/2007 | Shraim et al. | |
| 2007/0245409 A1 | 10/2007 | Harris et al. | |
| 2007/0253553 A1 | 11/2007 | Rahman et al. | |
| 2007/0294762 A1 | 12/2007 | Shraim et al. | |
| 2007/0299915 A1 | 12/2007 | Shraim et al. | |
| 2008/0016233 A1 | 1/2008 | Schneider | |
| 2008/0034416 A1 | 2/2008 | Kumar et al. | |
| 2008/0034425 A1 | 2/2008 | Overcash et al. | |
| 2008/0046616 A1 | 2/2008 | Verzunov et al. | |
| 2008/0049786 A1 | 2/2008 | Ram et al. | |
| 2008/0208752 A1 | 8/2008 | Gottlieb et al. | |

(56) References Cited

U.S. PATENT DOCUMENTS

| | | |
|---|---|---|
| 2008/0225720 A1 | 9/2008 | Khemani et al. |
| 2008/0225748 A1 | 9/2008 | Khemani et al. |
| 2008/0225753 A1 | 9/2008 | Khemani et al. |
| 2008/0229381 A1 | 9/2008 | Sikka et al. |
| 2010/0049850 A1 | 2/2010 | Nanduri et al. |
| 2011/0138179 A1 | 6/2011 | Jiang et al. |
| 2011/0202755 A1 | 8/2011 | Orsini et al. |
| 2012/0027024 A1 | 2/2012 | Liang |
| 2012/0036178 A1 | 2/2012 | Gavini et al. |
| 2012/0331159 A1 | 12/2012 | Srtom et al. |
| 2012/0331379 A1 | 12/2012 | Carro et al. |
| 2013/0283343 A1 | 10/2013 | Lim |
| 2015/0278397 A1* | 10/2015 | Hendrickson ..... G06F 17/30958 707/798 |

FOREIGN PATENT DOCUMENTS

| | | |
|---|---|---|
| EP | 2 043 328 A2 | 4/2009 |
| WO | WO-99/64967 A1 | 12/1999 |
| WO | WO-00/51031 | 8/2000 |
| WO | WO-02/39261 A2 | 5/2002 |
| WO | WO-02/39264 A2 | 5/2002 |
| WO | WO-02/39275 A2 | 5/2002 |
| WO | WO-02/39666 A2 | 5/2002 |
| WO | WO-02/39693 A2 | 5/2002 |
| WO | WO-02/39695 A2 | 5/2002 |
| WO | WO-02/41575 A2 | 5/2002 |
| WO | WO-02/43364 A2 | 5/2002 |
| WO | WO-02/45370 A2 | 6/2002 |
| WO | WO-2005/029313 A1 | 3/2005 |
| WO | WO-2005/029363 A1 | 3/2005 |
| WO | WO-2006/012612 | 2/2006 |
| WO | WO-2006/061843 A2 | 6/2006 |
| WO | WO-2006/074072 A3 | 7/2006 |
| WO | WO-2007/024647 A2 | 3/2007 |
| WO | WO-2007/065146 A2 | 6/2007 |
| WO | WO-2008/112691 A2 | 9/2008 |
| WO | WO-2008/112692 A2 | 9/2008 |
| WO | WO-2008/112698 A2 | 9/2008 |

OTHER PUBLICATIONS

Advisory Action for U.S. Appl. No. 11/465,894 dated Mar. 15, 2011.
Advisory Action for U.S. Appl. No. 11/465,915 dated Mar. 10, 2010.
Australian Examination Report on 2007281083 dated Nov. 30, 2010.
Barrett, R. et al., "Intermediaries: New Places for Producing and Manipulating Web Content," Computer Networks and ISDN Systems, North Holland Publishing, Amsterdam, NL, vol. 30, No. 1-7, Apr. 1998 (14 pages).
Chinese Office Action for CN Application No. 200780036904.8 dated Apr. 12, 2012.
Chinese Office Action on 200780024871.5 dated Nov. 23, 2011.
Chinese Office Action on 200780036904.8 dated Oct. 10, 2011.
European Office Action issued on Dec. 21, 2012 in European Patent Application No. 07812481.5.
Indian First Exam Report for Indian Application No. 5104/KOLNP/2008 dated Apr. 27, 2015.
International Preliminary Report on Patentability for PCT/US2007/072490, dated Jan. 6, 2009, 8 pages.
International Preliminary Report on Patentability issued Jul. 11, 2013 in PCT Application No. PCT/US2011/067369.
International Preliminary Report on Patentability, PCT/US2007/075037, mailed on Feb. 3, 2009.
International Search Report for International Application No. PCT/US2007/075178, mailed on Jan. 28, 2008.
International Search Report for PCT Application No. PCT/US2007/072490. Date of mailing: Mar. 12, 2008. 2 pages.
International Search Report issued Jun. 26, 2012 in PCT Application No. PCT/US2011/067369.
Notice of Allowance for U.S. Appl. No. 11/462,267 dated Sep. 12, 2014.
Notice of Allowance for U.S. Appl. No. 11/465,894 dated Dec. 5, 2012.
Notice of Allowance for U.S. Appl. No. 11/465,915 dated Nov. 9, 2012.
Office Action for U.S. Appl. No. 11/465,894 dated May 18, 2010.
Office Action for U.S. Appl. No. 11/465,894 dated Dec. 29, 2009.
Office Action for U.S. Appl. No. 11/465,894 dated Mar. 9, 2012.
Office Action for U.S. Appl. No. 11/465,915 dated Jun. 29, 2010.
Office Action for U.S. Appl. No. 11/465,915 dated Dec. 31, 2009.
Park J S et al: "Secure cookies on the Web", IEEE Internet Computing, IEEE Service Center, New York, NY, US, Jul. 1, 2000, pp. 36-44, XP002190888.
U.S. Office Action, dated Aug. 3, 2009, in U.S. Appl. No. 11/465,915, 12 pages.
US Final Office Action for U.S. Appl. No. 11/462,308 dated Feb. 24, 2010.
US Final Office Action for U.S. Appl. No. 11/462,300 dated Jan. 29, 2010.
US Non-final Office Action for U.S. Appl. No. 11/462,267 dated May 27, 2010.
US Non-final Office Action for U.S. Appl. No. 11/462,308 dated Aug. 4, 2009.
US Non-final Office Action for U.S. Appl. No. 11/462,308 dated Nov. 12, 2010.
US Non-final Office Action in U.S. Appl. No. 11/462,300 dated Jul. 8, 2009.
US Notice of Allowance for U.S. Appl. No. 12/790,400 dated May 8, 2014.
US Notice of Allowance for U.S. Appl. No. 13/337,735 dated Jun. 11, 2014.
US Notice of Allowance for U.S. Appl. No. 13/760,898 dated Jun. 4, 2014.
US Notice of Allowance for U.S. Appl. No. 13/850,848 dated Apr. 24, 2014.
US Notice of Allowance for U.S. Appl. No. 11/462,308 dated Nov. 23, 2012.
US Office Action U.S. Appl. No. 14/594,963 DTD Sep. 9, 2015.
US Office Action dated Jul. 29, 2009 in U.S. Appl. No. 11/465,894 (13 pages).
US Office Action for U.S. Appl. No. 11/465,915 dated Dec. 3, 2010.
US Office Action for U.S. Appl. No. 11/462,267 dated Oct. 28, 2013.
US Office Action for U.S. Appl. No. 11/462,267 dated May 6, 2014.
US Office Action for U.S. Appl. No. 11/465,894 dated Oct. 27, 2010.
US Office Action for U.S. Appl. No. 11/465,894 dated Sep. 20, 2011.
US Office Action for Application No. 12/790,400 dated Jan. 23, 2013.
US Office Action for U.S. Appl. No. 12/790,400 dated Nov. 16, 2011.
US Office Action for U.S. Appl. No. 12/790,400 dated Dec. 16, 2013.
US Office Action for U.S. Appl. No. 12/790,400 dated May 31, 2011.
US Office Action for U.S. Appl. No. 12/790,400 dated Jul. 12, 2013.
US Office Action for U.S. Appl. No. 12/790,400 dated Aug. 2, 2012.
US Office Action for U.S. Appl. No. 13/337,735 dated Nov. 1, 2013.
US Office Action for U.S. Appl. No. 13/337,735 dated Feb. 11, 2013.
US Office Action for U.S. Appl. No. 13/850,848 dated Feb. 13, 2014.
US Office Action for Application No. 13/850,848 dated Aug. 1, 2013.
US Office Action for U.S. Appl. No. 13/370,989 dated Nov. 19, 2013.
US Office Action for U.S. Appl. No. 11/462,267 dated Nov. 10, 2010.
US Office Action for U.S. Appl. No. 11/462,267 dated Nov. 10, 2011.
US Office Action for U.S. Appl. No. 11/462,267 dated Mar. 7, 2012.

(56) References Cited

OTHER PUBLICATIONS

US Office Action for U.S. Appl. No. 11/462,267 dated May 11, 2011.
US Office Action for U.S. Appl. No. 11/462,300 dated Feb. 14, 2011.
US Office Action for U.S. Appl. No. 11/462,308 dated Nov. 12, 2011.
US Office Action for U.S. Appl. No. 11/462,308 dated May 10, 2011.
US Office Action on U.S. Appl. No. 14/448,298 DTD Sep. 24, 2015.
Written Opinion of the International Searching Authority for International Application No. PCT/US2007/075178, mailed on Jan. 28, 2008.
European Examination Report on EP Application No. 07813757.7 dated Mar. 2, 2016.
US Notice of Allowance on U.S. Appl. No. 14/448,298 dated Mar. 31, 2016.
US Office Action on U.S. Appl. No. 14/594,963 DTD Mar. 15, 2016.
US Office Action on U.S. Appl. No. 14/594,963 dated Sep. 19, 2016.
U.S. Appl. No. 11/439,003, filed May 22, 2006.
U.S. Appl. No. 14/448,265, filed Jul. 31, 2014.
U.S. Appl. No. 11/462,267, filed Aug. 3, 2006.
U.S. Appl. No. 14/594,963, filed Jan. 12, 2015.
U.S. Appl. No. 11/428,058, filed Jun. 30, 2006.
U.S. Appl. No. 12/790,400, filed May 28, 2010.
U.S. Appl. No. 11/462,308, filed Aug. 3, 2006.
U.S. Appl. No. 11/465,915, filed Aug. 21, 2006.
U.S. Appl. No. 13/760,898, filed Feb. 6, 2013.
U.S. Appl. No. 11/439,009, filed May 22, 2006.
U.S. Appl. No. 14/448,298, filed Jul. 31, 2014.
U.S. Appl. No. 14/077,119, filed Nov. 11, 2013.

\* cited by examiner

PRIOR ART

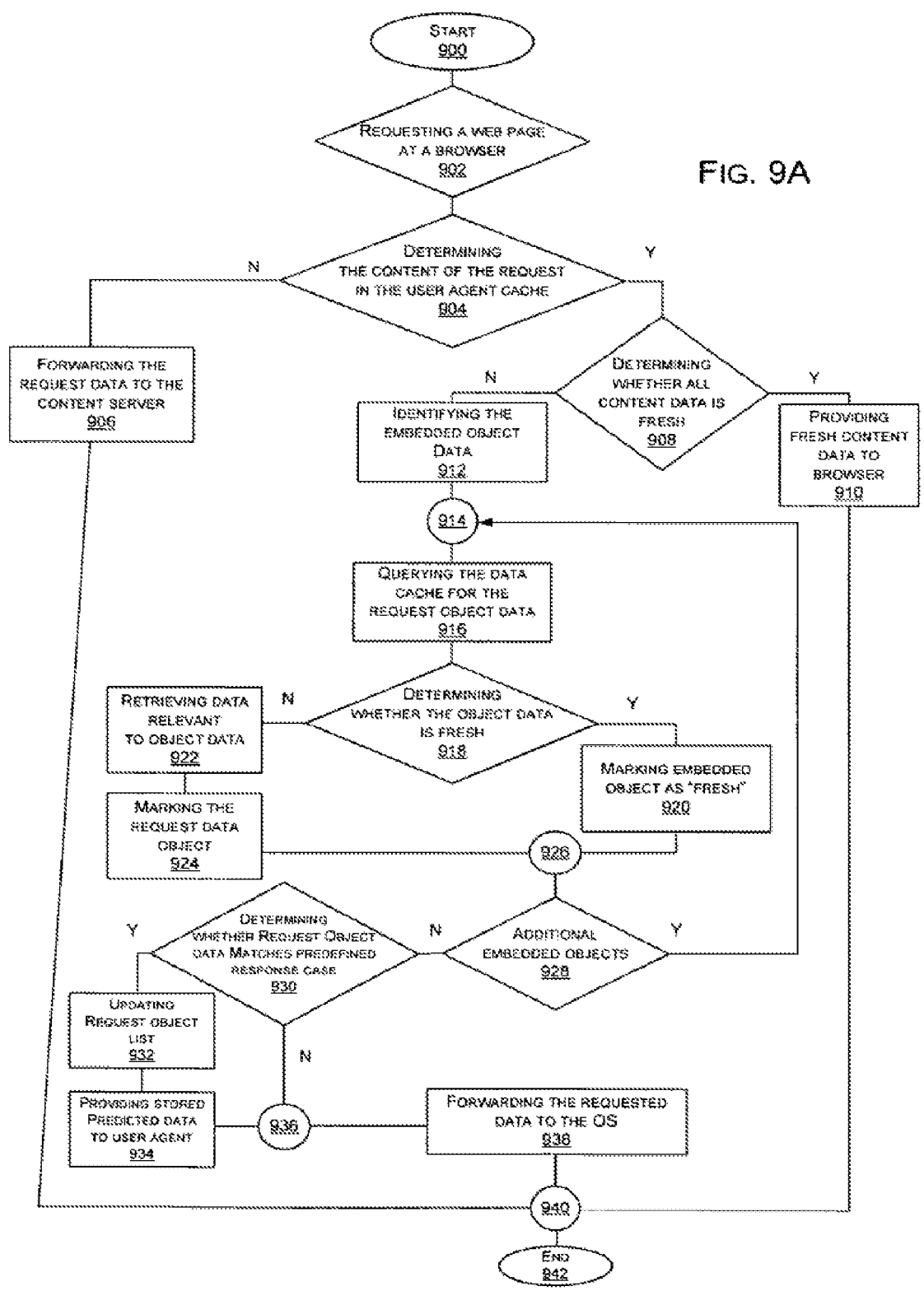

SYSTEMS AND METHODS FOR ENHANCED DELTA COMPRESSION

RELATED APPLICATIONS

The present application is a continuation-in-part of and claims priority to and benefit of U.S. Non-provisional application Ser. No. 11/439,003, entitled "Method and System For Object Prediction" and filed on May 22, 2006, which claims priority to and benefit of U.S. Provisional Application No. 60/685,260, entitled "Advanced Data Optimization" and filed May 26, 2005; and the present application is also a continuation-in-part of and claims priority to and benefit of U.S. Non-provisional application Ser. No. 12/790,400 entitled "Method and Systems For Efficient Delivery Of Previously Stored Content" and filed on May 28, 2010, which is a continuation of and claims priority to and benefit of U.S. Non-provisional application Ser. No. 11/428,058, entitled "Method and Systems For Efficient Delivery Of Previously Stored Content" and filed on Jun. 30, 2006, and now issued as U.S. Pat. No. 7,756,826, all of which are incorporated herein by reference in their entirety for all purposes.

FIELD OF THE DISCLOSURE

The present application is directed to Internet and computer network content delivery and, more particularly, to systems and methods for reducing file sizes for files delivered over a network.

BACKGROUND

The Internet allows for vast amounts of information to be communicated over any number of interconnected networks, computers, and network devices.

In many network environments, bandwidth is a scarce resource. Bandwidth may be limited by the connection infrastructure of the environment or the maximum transmission or reception speeds of devices on the network. Where bandwidth is scarce, significant improvements in transmission time can be achieved by reducing the size of files transmitted over a network.

Another common feature of networks, including the internet and the World Wide Web, is the transmission of redundant data. For example, often a client may request the same file on different days to observe any changes that have taken place. A large portion of the file data may be redundant in that it has already been transmitted to the user. For example, if the file is the web page of a newspaper, the headings and formatting information will remain constant. As another example, a client may load a file several times within a single hour, for example if the file is a web page listing updated sports scores. In this example, the only data that changes from viewing to viewing may be the scores themselves, and the team names, logos, and formatting will remain unchanged.

Several systems and methods already exist for taking advantage of this redundancy to reduce the size of transmitted files. Many web browsers store images from sites a user has already visited so that they do not need to be retransmitted if the user returns to the site. While this method is effective, it is typically limited only to standard image files, and cannot reduce file sizes for pages comprising large amounts of text, scripts, or formatting information. Many web sites utilize frames, applets, or scripts to control web pages so that only the portion of a page that has changed will be retransmitted. The drawback of this approach is that programming a site to use these techniques often requires substantial developer time and resources, and may require recoding previously existing files. Thus there exists a need for means to leverage the redundancy found in many network transmissions to reduce the size of transmitted files that may be easily applied to both presently existing and future files.

SUMMARY

Typically, information or content is located at websites on one or more servers, and a user can retrieve the content using a user agent, such as a web browser, running on a client device. For example, the user can input a webpage address into the web browser or access a web link, which sends requests to a server to access and provide the content on the respective website. This type of communication is commonly referred to as "web browsing."

Web browsing is enjoyed by millions of users on the Internet. However, accessing content on a network that is constrained by bandwidth and latency can make web browsing less enjoyable. Bandwidth is the measurement of the speed of a network link. Lower bandwidth network links take more time to transfer content than higher bandwidth links. Latency is a measurement of the responsiveness of a network link. Higher latency networks take more time than lower latency networks to send a single byte of data over a network link.

Many networks can suffer from low bandwidth and/or high latency problems that degrade the enjoyment of web browsing for users. Wireless wide area networks (WANs), such as GPRS or CDMA 1xRTT wireless networks, are just a few networks, along with traditional plain old telephone (POTS) dialup networks, that can exhibit bandwidth and latency problems. These networks may take 50 to 100 seconds to download content from a web page due to bandwidth and latency constraints, whereas a high-speed local area network (LAN) may be less prone to such constraints and can download the same content in 5 to 10 seconds. Waiting a long time to view content for a web page is annoying to users and inefficiently utilizes the network.

Utilizing a network efficiently is also a particular concern for network providers who must share limited resources among many users. For example, wireless WAN providers share very expensive and limited spectrum among all of its data and voice subscribers. Thus, efficient use of the spectrum frequencies is imperative. Furthermore, in a wireless WAN environment, data transmission is more susceptible to interference and noise in contrast to a wired environment. Interference and noise delay the data transmission process and, more importantly, cause variability and unpredictability in the delay. A web site that may download objects in 50 seconds the first time may download the same objects in 100 seconds the next time. Thus, in order to address these concerns, network providers must efficiently use existing network infrastructure to provide the most efficiency to a user when downloading content.

Furthermore, the manner in which information is transferred on a network plays an important role in the network's efficiency. Referring to the World Wide Web (WWW), the Hypertext Transfer Protocol (HTTP) sets forth the rules for transferring content such as files or objects on the web. This protocol uses requests and responses for transferring content. For example, a user agent (e.g., a web browser) sends a request to the content server for a particular file or object of a web page and the server of the web page queries the object in a database and sends back the object as part of a response to the user agent. This process continues until every object in the web page has been downloaded to the user agent.

As web pages have become more complex, a common web site may contain hundreds of objects on its web pages. Such objects may include text, graphics, images, sound, etc. The web pages may also have objects located across multiple servers. That is, one server may provide dynamic content (e.g., content that remembers the last books ordered by a user) for a web page, whereas other servers may provide static but rotating content such as an advertisement, and still others provide the static content of the site. As such, before a user can view a web page, hundreds of objects may require downloading from multiple servers. Each server, however, may take a different amount of time to service a request for an object contributing to latency. Thus, the latency for each server may vary with different levels of magnitude, e.g., one server may respond in milliseconds whereas another server may respond in seconds.

Latency constraints, however, should not be confused with bandwidth constraints. FIG. 1 illustrates the retrieval sequence for objects on a bandwidth constrained network using HTTP over TCP/IP. In this illustration, each request for an object requires a connection to be established between a client and a server with an exchange of "SYN" and "ACK" messages necessary for TCP/IP. Due to the relatively small latency of the network and the responsiveness of the server, the ACK message is sent back to the client quickly. However, because the network is bandwidth constrained, a response back to the client takes a relatively long time. This is exacerbated if the object for the request is large in nature and must be broken into many packets as shown in FIG. 1. As a result, the overall download time for each request/response is dominated by the time it takes to download all the packets of the individual objects on a network link. Such download time can be calculated by adding the size of each of the individual objects and dividing the aggregate size by the link bandwidth.

FIG. 2 illustrates the retrieval sequence for objects on a latency constrained network using HTTP over TCP/IP. In this illustration, the network is not limited by bandwidth, but instead by the latency or the time it takes to send a packet from the client to the server through the network. In particular, when a user agent requests small objects on a network affected by high latency, the overall download time is dominated by the time it takes a request to travel to the server, the responsiveness of the server to process the request, and the time it takes for a response to travel back to user agent. The download time of a web page with many objects can be calculated by adding the round trip time (RTT) for the request to travel to the server and the response to travel back to the client in addition to the response of the server and multiplying that by the number of objects on the web page.

Unfortunately, user agents are in fact a source of latency when downloading an object. This latency is a result of the user agent processing the downloaded objects and attempting to display these objects in the manner the web page designers intended. Web page designers use a multitude of different standards to instruct the user agents how a web page is supposed to look once rendered. The number of standards is increasing over time and include markup languages (e.g., Hyper Text Markup Language (HTML), Extensible HTML (XHTML), Wireless Markup Language (WML)), objects that define the overall style of the page (e.g., Cascading Style Sheets (CSS)), objects that are executed by the user agent (e.g., JavaScript), and image objects (e.g., JPEG, GIF, PNG). After downloading each object the user agent needs time to process and determine the impact of each object on the displayed web page. The processing time of each object may impact the download of subsequent objects. For CPU constrained devices (e.g., phones) the latency from browser processing time can contribute significantly to the overall download time of a web page. Also, for poorly implemented user agents certain objects may significantly impact the time to render a web page. Even over a high bandwidth and low latency network, the implementation of the user agent can result in these object processing times severely impacting the download time of the web page. number of standards is increasing over time and include markup languages (e.g., Hyper Text Markup Language (HTML), Extensible HTML (XHTML), Wireless Markup Language (WML)), objects that define the overall style of the page (e.g., Cascading Style Sheets (CSS)), objects that are executed by the user agent (e.g., JavaScript), and image objects (e.g., JPEG, GIF, PNG). After downloading each object the user agent needs time to process and determine the impact of each object on the displayed web page. The processing time of each object may impact the download of subsequent objects. For CPU constrained devices (e.g., phones) the latency from browser processing time can contribute significantly to the overall download time of a web page. Also, for poorly implemented user agents certain objects may significantly impact the time to render a web page. Even over a high bandwidth and low latency network, the implementation of the user agent can result in these object processing times severely impacting the download time of the web page.

Some embodiments of the present solution provides an efficient mechanism by which the transmitted file sizes can be significantly reduced for files comprising data that has previously been transmitted. The invention may make this reduction possible without the need for file specific, application specific, or network specific solutions, and thus may not require substantial developer investment.

In one aspect, the present solution is a method for creating efficient updates to a previously stored file. The method comprises receiving a first file comprising sequences of data; creating a hash table having entries corresponding to overlapping sequences of data; receiving a second file comprising sequences of data; comparing each of the sequences of data in the second file to the sequences of data in the hash table to determine sequences of data present in both the first and second files; storing representations of lengths and locations of said sequences of data present in both the first and second files; and creating a third file comprising sequences of data from the second file and representations of locations and lengths of said sequences of data present in both the first and second files.

In another aspect, the present solution is a method of receiving efficient updates to previously stored files. The method comprises receiving a first file comprising sequences of data, receiving a second file comprising sequences of data and representations of locations and lengths of sequences in the first file, and executing a Javascript function to create a third file comprising sequences of data from the second file and sequences in the first file indicated by the second file.

In yet another aspect, the present solution is a computer system for creating efficient updates to a previously stored file. The system comprises a transceiver which receives a first and second file, each file comprising a respective plurality of sequences of data; a hash engine which communicates with said transceiver and computes hash values for sequences of data in the first and second file, wherein at least two of said sequences overlap, and determines sequences of data present in both the first and second files; a storage element in communication with said hash engine which stores representations of the lengths and locations of said sequences present in both the first and second files; and a processor in communication with said storage element which creates a third file comprising sequences of data from the second file and representations of lengths and locations of said sequences present in both files.

In some aspects, the present solution is directed to an enhanced efficient updates to objects and/or files on a client. The method may include receiving, by a device intermediary to a plurality of clients and a server, a response from the server to a request for a web page by a client of the plurality of clients. The device may store a first file comprising a first plurality of sequences of data from a previous response served by the server. The method may include generating, by the device, an object list identifying object data within the response that is to be downloaded to the client. The method may also include maintaining, by the device, a hash table having a plurality of entries, each of the plurality of entries corresponding to a respective one of a first plurality of sequences of data in the first file. At least two of the entries may correspond to overlapping sequences of data. The method may further include computing, by the device, hash values of a second plurality of sequences of data from the response for a second file and comparing each of the second plurality of sequences of data with sequences from the first plurality of sequences having the same hash value to determine sequences of data present in both the first file and second file, The method may include creating, by the device, a third file comprising sequences of data from the second file and a representation of a location and a length of a first sequence of data present in both the first file and second file. The representation of the location may identify a number of bytes between the first sequence of data and a second sequence of data present in both the first file and the second file, and the length may identify a number of matching bytes of the first sequence of data. The device may transmit the third file and the object list to the client.

In some embodiments, the method includes determining, by the device, whether each object data within the response is to be downloaded to a user agent of the client and generating the object list based on the determination. In some embodiments, the method includes receiving, by the device, request object data constructed by the client using the object list. The request object data includes a request object list identifying object data and freshness data indicating that the object data is one of fresh or stale. In some embodiments, the method includes determining, by the device, whether object data within the response matches object data of the request object data.

In some embodiments, the method includes indicating, by the device, that the object data is to be downloaded if the object data within the response does not match the object data of request object data. In some embodiments, the method includes determining, by the device, whether object data of the request object data is indicated by freshness data to be fresh or stale responsive to the object data within the response matching the object data of the request object data. In some embodiments, the method includes verifying with the server the request object data is fresh or stale if the request object data is indicated by the freshness data to be stale. In some embodiments, the method includes indicating that the object data is to be downloaded if the request object data is verified to be stale.

In some embodiments, the method includes creating the third file comprising sequences of data from the second file and representations of locations and lengths of sequences present in both the first file and the second file, wherein the locations are represented as a relative distance from a location in the first file. In some embodiments, the method includes creating the third file comprising sequences of data from the second file and representations of locations and lengths of sequences present in both the first file and the second file. The third file may be translated into a byte sequence using a byte encoding protocol.

In some aspects, the present solution is directed a system comprising a device intermediary to a plurality of clients and one or more servers. The device may be configured to receive a response from the server to a request for a web page by a client of the plurality of clients and configured to store a first file comprising a first plurality of sequences of data from a previous response served by the server. A generator of the device may be configured to generate an object list identifying object data within the response that is to be downloaded to the client; a hash engine of the device configured to maintain a hash table having a plurality of entries. Each of the plurality of entries corresponding to a first plurality of sequences of data in the first file, and at least two of the entries correspond to overlapping sequences of data. The hash engine may be configured to compute hash values of a second plurality of sequences of data of the response for a second file. The device may be further configured to compare each of the second plurality of sequences of data with sequences from the first plurality of sequences having the same hash value to determine sequences of data present in both the first file and the second file; and create a third file comprising sequences of data from the second file and a representation of a location and a length of a first sequence of data present in both the first file and the second file. The representation of the location identifies a number of bytes between the first sequence of data and a second sequence of data present in both the first file and the second file. The length identifying a number of matching bytes of the first sequence of data. The device is also configured to transmit the third file and the object list to the client.

In some embodiments, the generator is further configured to determine whether each object data within the response is to be downloaded to a user agent of the client and generating the object list based on the determination. In some embodiments, the device is further configured to receive request object data constructed by the client using the object list. The request object data includes a request object list identifying object data and freshness data indicating that the object data is one of fresh or stale. In some embodiments, the device is further configured to determine whether object data within the response matches object data of the request object data. In some embodiments, the device is further configured to indicate that the object data is to be downloaded if the object data within the response does not match the object data of request object data.

In some embodiments, the device is further configured to determine whether object data of the request object data is indicated by freshness data to be fresh or stale responsive to the object data within the response matching the object data of the request object data. In some embodiments, the device is further configured to verify with the server the request object data is fresh or stale if the request object data is indicated by the freshness data to be stale. In some embodiments, the device is further configured to indicate that the object data is to be downloaded if the request object data is verified to be stale.

In some embodiments, the device is further configured to create the third file comprising sequences of data from the second file and representations of locations and lengths of sequences present in both the first file and the second file, wherein the locations are represented as a relative distance from a location in the first file. In some embodiments, the device is further configured to create the third file comprising sequences of data from the second file and representations of locations and lengths of sequences present in both the first file and second the second file, wherein the third file is translated into a byte sequence using a byte encoding protocol.

BRIEF DESCRIPTION OF THE DRAWINGS

The foregoing and other objects, aspects, features, and advantages of the present solution will become more apparent and may be better understood by referring to the following description taken in conjunction with the accompanying drawings, in which:

FIG. 4 is a block diagram illustrating an embodiment of the exemplary system of

FIG. 1;

FIGS. 9A and 9B are flowcharts representing exemplary methods for providing object prediction at a user agent and a client device;

DETAILED DESCRIPTION

Reference will now be made in detail to the exemplary embodiments implemented according to the present solution, the examples of which are illustrated in the accompanying drawings. Wherever possible, the same reference numbers will be used throughout the drawings to refer to the same or like parts.

Figure 1:
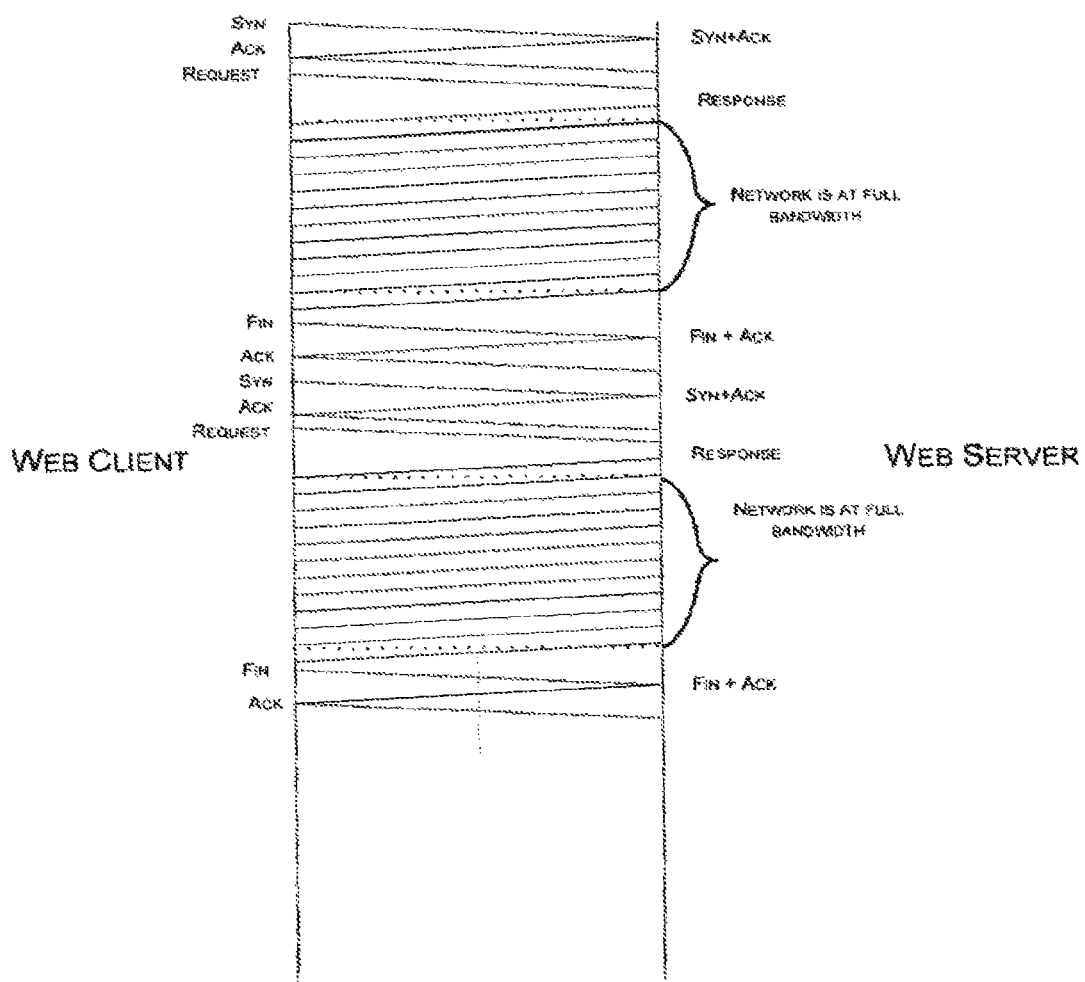
FIG. 1 illustrates the retrieval sequence for objects on a bandwidth constrained network using HTTP over TCP/IP.
Figure 2:
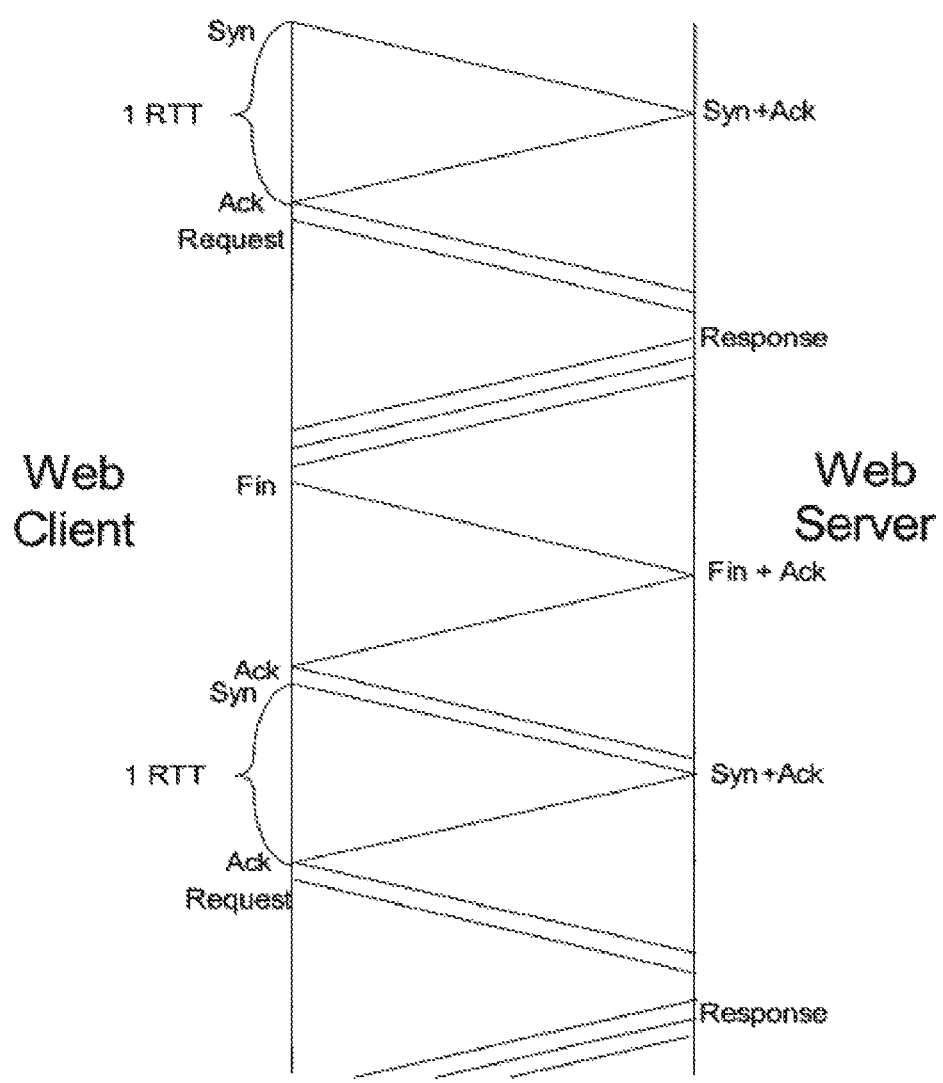
FIG. 2 illustrates the retrieval sequence for objects on a latency constrained network using HTTP over TCP/IP.
Figure 3:
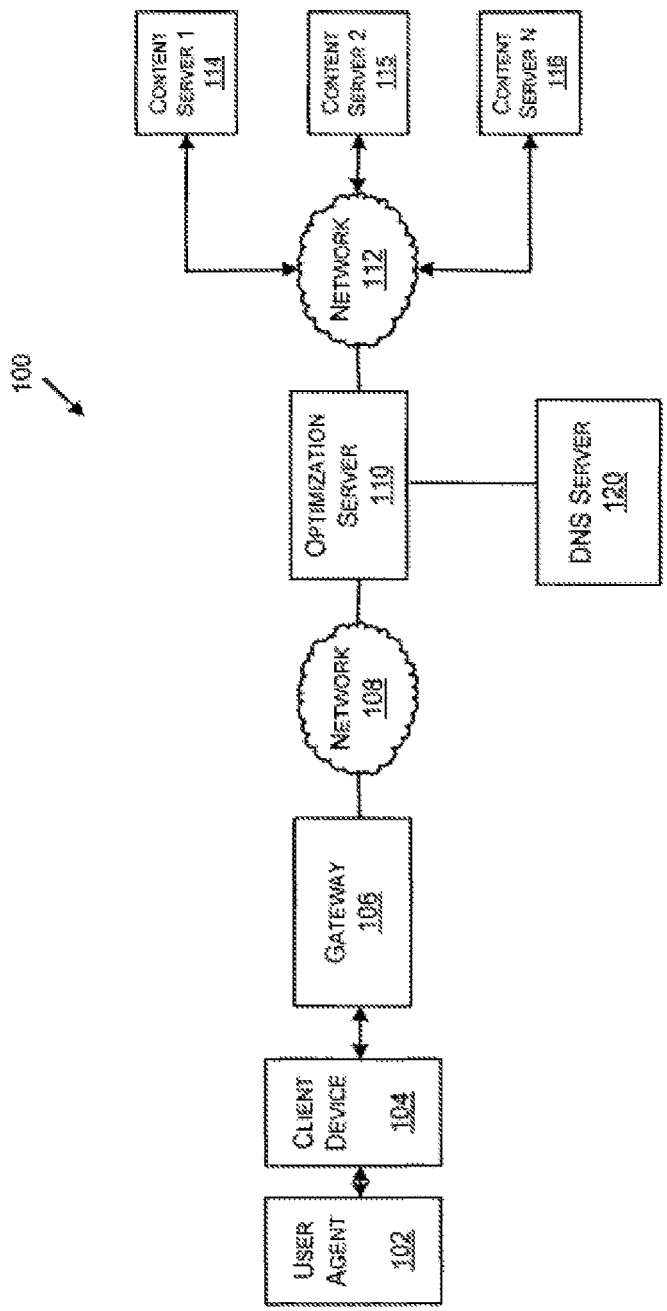
FIG. 3 is a block diagram of an exemplary system.

FIG. 3 is a block diagram of an exemplary system. Exemplary system 100 can be any type of system that transmits data over a network. For example, the exemplary system can include a browser accessing information from content servers through the Internet. The exemplary system can include, among other things, a user agent 102, a client device 104, a gateway 106, one or more networks 108, 112, an optimization server 110, one or more content servers 114-116, and a DNS server 120.

User agent 102 is a client application used with a network protocol. For example, user agent 102 could be a web browser, a search engine crawler, a screen reader, or a Braille browser, and the user agent 102 could be used to access the Internet. User agent 102 can be a software program that transmits request data (e.g., an HTTP/WAP request data) to a web server and receives response data in response to the request data. For example, user agent 102 can send request data to the content servers 114-116 for a particular file or object data of a web page identified by a URL, and the content server of the web page can query the object data in a database and can send back the object data as part of the response data (e.g., HTTP/WAP response data) to the user agent. This process continues until every object in the web page has been downloaded to the user agent.

Client device 104 is a computer program or terminal that can access remote services. Client device 104 can receive request data from the user agent 102, can transmit the request data to the content servers, and can receive response data in response to the request data. For example, the client device 104 can be Bytemobile Optimization Client Software. Client device's functionality is further described below. In some embodiments, user agent 102 and client device 104 can be housed in the same device, such as a computer, a PDA, a cell phone, a laptop, or any device accessing the Internet. Furthermore, client device 104 can be embedded within user agent 102.

Gateway 106 is a device that converts formatted data provided in one type of network to a particular format required for another type of network. Gateway 106, for example, may be a server, a router, a firewall server, a host, or a proxy server. The gateway 106 has the ability to transform the signals received from client device 104 into a signal that network 108 can understand and vice versa.

Networks 108 and 112 can include any combination of wide area networks (WANs), local area networks (LANs), or wireless networks suitable for networking communication such as Internet communication.

Optimization server (OS) 110 is a server that provides communication between gateway 106 and content servers 114-116. For example, OS 110 could be a Bytemobile Optimization Services Node. OS 110 can optimize performance by enabling significantly faster and more reliable service to customers. OS's 110 can include optimization techniques, which are further described below.

Content servers 114-116 are servers that receive the request data from the user agent 102, processes the request data accordingly, and return the response data back to the user agent 102. For example, content servers 114-116 can be a web server, an enterprise server, or any other type of server. Content servers 114-116 can be a computer or a computer program that is responsible for accepting HTTP requests from the user agent and serving the user agents with HTTP responses.

Domain Name System (DNS) server 120 is a server that associates many types of information to domain names. DNS server 120 maps the fully qualified domain name (FQDN) of a URL to the IP address associated with the FQDN. For example, DNS server 120 makes it possible to attach hard-to-remember IP addresses (such as 209.10.233.130) to easy-to-remember domain names (such as "bytemobile.com."). DNS server 120 can also list mail exchange servers accepting e-mail for each domain.

Figure 4:
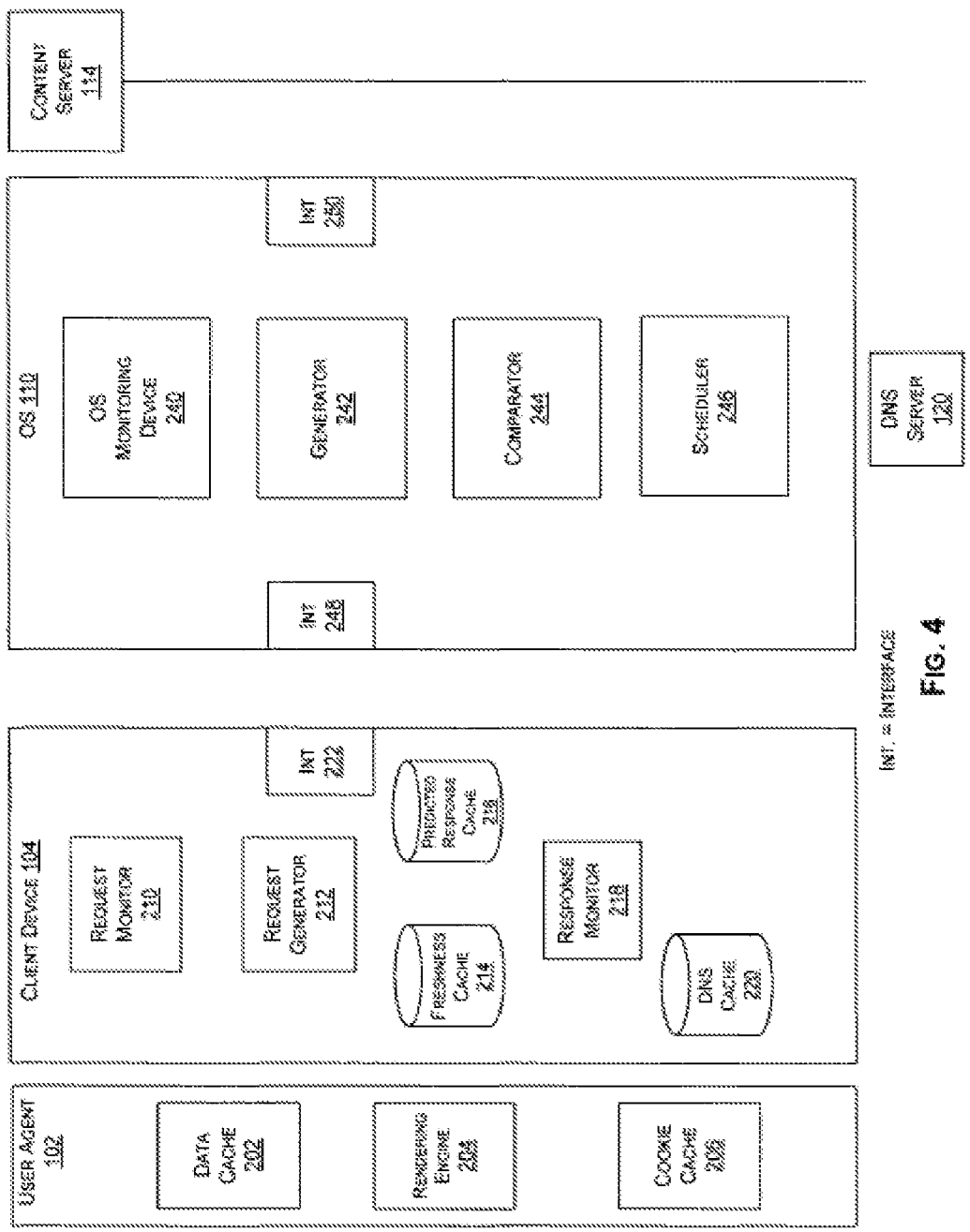

FIG. 4 is a block diagram illustrating an embodiment of the exemplary system of FIG. 3. User agent 102 may include, among other things, a data cache 202, rendering engine 204, and a cookie cache 206.

Data cache 202 is a storage device that stores web documents to reduce bandwidth usage and web page access times. Data cache 202 stores copies of object data requested and received by the user. Subsequent web page requests may be satisfied by accessing the data cache 202 if certain conditions are met. Such conditions may include whether the object data is located in the data cache 202 and whether the object data is deemed fresh or stale. For example, the freshness of the object data can be defined by the definition of 'fresh' and 'stale' in RFC 1945 and RFC 2616.

Rendering engine 204 can be a software application that enables a user agent to display and interact with text, images, and other information located on a webpage. When a user types in a web address or URL into the user agent 102, the rendering engine 204 uses Hypertext Transfer Protocol (HTTP) to initiate the request with the content server, e.g., content server 114. Although rendering engines can be used to access the Internet, they can also be used to access data provided by web servers in private networks or content in file systems.

Cookie cache 206 is a device that stores data relating to cookies. In some embodiments, cookie cache 206 is located on the hard drive on the client device that the user agent runs. Cookie cache can include cookies, which can include, among other things, user IDs, passwords, preference data, etc.

Client device 104 may include, among other things, a request monitor 210, a request generator 212, a freshness cache 214, a predicted response cache 216, a response monitor 218, a DNS cache 220, and an interface 222.

Request monitor 210 can be a software program or a hardware device that receives or intercepts the request data, such as an HTTP request, from the rendering engine 204. Request monitor 210 can identify the embedded request object data (e.g., embedded URLs) located with the request data and create a request object list that includes the request object data, the freshness data of the request object data, FQDN of the request object data, and/or any cookie data associated with the request object data. Request monitor 210 has the ability to communicate with user agent 102 to determine whether the request object data and any cookie data associated with the request object data are stored in the user agent 102 and if so, whether the request object data is fresh or stale. Request monitor 210 has the ability to forward to OS 110 the request data and, if available, the request object list.

Request generator 212 can be a software program or a hardware device that constructs predicted request data. Request generator 212 constructs predicted request data by accumulating object data, mapping data linking the FQDN of the object data to an IP address of the FQDN, and cookie data associated with the object data. This allows request generator 212 to mimic, as closely as possible, subsequent request data. Furthermore, request generator 212 may use a user agent string and other request data headers to help mimic the subsequent request data. In some embodiments, request generator 212 flags the predicted request data to indicate that it is a predicted request and not an original request. Request generator 212 has the ability to forward the predicted request data through OS 110 to content servers 114-116.

Freshness cache 214 is a device that stores the freshness data of object data that the user agent has determined to be stale. For example, freshness cache 214 can be a list, an array, a database, a cache, etc. When the client device 104 receives request data from the user agent and the request data includes request object data that is stale, the freshness cache 214 can be accessed to determine whether that stale object data is actually fresh. If the stale object data is indeed fresh, client device 104 can inform the user agent that the object data stored in the data cache 202 is fresh. Freshness cache 214 receives freshness data from response monitor 218 when optimized data includes the freshness data.

Predicted response cache 216 is a storage device that stores for a configurable amount of time predicted response data and stored predicted request data that identifies the predicted response data. Predicted response cache 216 can provide predicted response data to the request monitor if the request data for a particular web page from the user agent 102 matches stored predicted request data identifying the predicted response data stored at the predicted response cache 216. This stored predicted request data can be matched to request data received by the request monitor 210 and acts as a cross reference to the predicted store data. For example, the predicted response cache can receive request object data, cookie data of the request object data, data cache parameters, and the user agent making the request to determine whether the request data matches the stored request data identifying the predicted response data. After a configurable amount of time has elapsed, the predicted response cache 216 can discard portions of the unused predicted response data and the stored predicted request data. Predicted response cache 216 receives response data corresponding to a stale request object data from response monitor 218 when optimized data includes this response data.

Response monitor 218 can be a software program or a hardware device that receives optimized data from the OS 110. The optimized data can include, among other things, response data received from a content server, response object list providing response object data, any mapping data, any freshness data for a request object data that was marked as stale and verified by the content server to be fresh ("fresh" stale object data), and/or response data corresponding to a stale request object data. After receiving the optimized data, the response monitor 218 separates the optimized data and processes the separated data accordingly. Response monitor 218 is communicatively coupled to DNS cache 220, freshness cache 214, predicted response cache 216, and user agent 102.

DNS cache 220 is a data storage device that stores mapping data linking the FQDN of the object data to an IP address of the FQDN. DNS cache 220 receives mapping data from response monitor 218 when the optimized data includes the mapping data. Additionally, DNS cache 220 allows client device 104 and user agent 102 the ability to map the FQDN of the URL to the IP address without having to access the DNS server 120. By providing mapping data to the response monitor 218, the mapping data assists the request generator 212 in constructing the request.

Interface 222 is a software program or a hardware device that communicatively couples the client device 104 to the communication means (e.g., wireless and/or wired) connecting the client device 104 and the OS 110. Interface 222 is configured to receive the request data from the request monitor, translate the request data, and transmit the translated request data to the OS 110. Further, interface 222 is configured to receive information from the communication means connecting the client device 104 and the OS 110. In some embodiments, the interface 222 can include encryption means and/or decryption means to encrypt communication leaving from and decrypt communication coming into client device 104.

Optimization server (OS) 110 may include, among other things, an OS monitoring device 240, a generator 242, a comparator 244, a scheduler 246, and a plurality of interfaces 248 and 250.

OS monitoring device 240 is a software program or a hardware device that monitors the request data received through the interface 248 from the client device 104. In some embodiments, the request data may include additional appended data, such as the request object list identifying request object data, the freshness data of the request object data, and any cookie data associated with the request object data. In some embodiments, the request object list includes the object data, the freshness data and the cookie data. When the OS monitoring device 240 receives the request data, the OS monitoring device 240 can extract any appended data from the request data and transmit the original request data from the user agent through interface 250 to the content server 114. OS monitoring device 240 can provide the extracted appended data to comparator 244.

Generator 242 is a software program or a hardware device that receives the response data from content server 114. Generator 242 can analyze the response data and determine if the response data contains references to embedded response object data that user agent 102 would have to download. For example, a GIF image would not contain references to other content data for a rendering engine to download, while a markup language (e.g., WML, HTML, XHTML, etc.) can have references to other response object data that rendering engine 204 would have to download. Generator 242 could then have the ability to generate a response object list that identifies the response object data and the FQDN of the response object data.

Comparator 244 is a software program or a hardware device that receives request object list from OS monitoring device 240 and response object list from generator 242 and compares them. An exemplary comparing method is further described below in FIG. 11. Based on the comparison, the comparator 244 can update the response object list. After the comparison, the comparator 244 can transmit optimized data, which can include, among other things, response data received from the content server, response object list providing response object data, any mapping data, any freshness data for a request object data that was marked as stale and verified by the content server to be fresh ("fresh" stale object data), and/or response data corresponding to a stale request object data.

Scheduler 246 is a software program or a hardware device that receives a response data and/or predicted response data from content server and schedules the response data back to the client device 104. For example, the scheduler 246 may give preferences to response data over predicted response data from the request generator 212. Another example may include the scheduler 246 giving preference to object data appearing earlier in the response data over object data appearing later in the response data.

Interfaces 248 and 250 are similar to interface 222 of the client device 104. Each interface has the ability to communicate with the elements of the optimization server, translate the communication so that the communication means can utilize the data, and transmit the translated communication across the corresponding communication means. Like interface 222, interfaces 248 and 250 may have encryption and decryption means.

Figure 5:
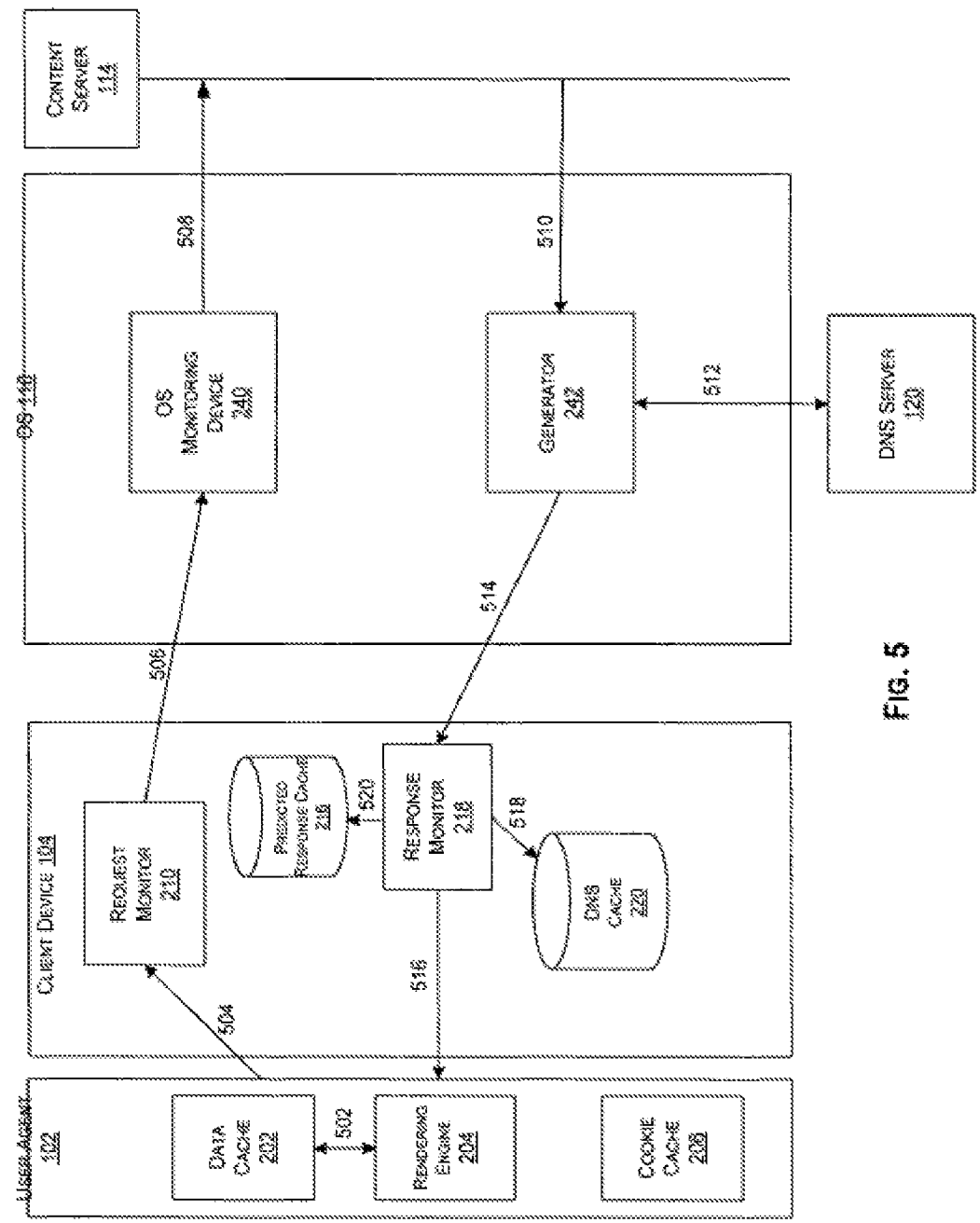
FIG. 5 is a functional diagram illustrating an exemplary communication flow in the exemplary system of FIG. 4.

FIG. 5 is a functional diagram illustrating an exemplary communication flow in the system of FIG. 4. It is assumed for the purposes of explaining this exemplary communication flow that when a web page is first requested by the rendering engine 204, the HTML content data of the web page does not reside in a data cache 202 of the user agent 102 although other components of the web page may reside in the data cache 202. In addition, while a single content server 114 has been displayed for simplicity purposes, any number of content servers could be provided. The user inputs. a URL into a user agent 102. Rendering engine 204 queries (502) the data cache 202 for any content data relating to the URL and, under the assumed conditions, data cache 202 does not return any content data to rendering engine 204. In some embodiments, rendering engine 204 can also query cookie cache 206 for any cookie data associated with the URL.

After the query, the rendering engine 204 transmits (504) the request data (e.g., HTTP request of the URL) to the content server 114. The request monitor 210 at the client device 104 can receive or intercept the request data. Alternatively, in some embodiments, the user agent 102 can send the request data over a wireless link. The request monitor 210 forwards (506) the request data to the OS 110. The request data can be directed explicitly to a gateway or proxy and then to the OS 110, or it can be directed to the content server 114 and the request can be intercepted transparently by an inline proxy or gateway. The OS 110 analyzes the request data and determines whether the request is transmitted from either a user agent (e.g., user agent 102) or a client device (e.g., client device 104) that contains the client hardware/software understanding the prediction protocol. As in this case, the OS 110 determines that the client device 104 has the capabilities and forwards (508) the request data to the appropriate content server 114. Consequently, the content server 114 provides (510) response data (e.g., HTTP response of the requested URL) associated with the request data to the generator 242 of the OS 110.

After the generator 242 has received the response data, generator 242 analyzes the response data to determine if the response data includes references to embedded response object data (e.g., embedded URLs within the HTTP response) that the rendering engine 204 would have to download. For example, a GIF image might be compressible by the proxy, but it does not contain references to other content that a web browser would have to download, while a markup language can have references to other response object data that the web browser would have to download. The generator 242 can parse through the response data and create a response object list that identifies embedded response object data within the response data. For example, the response object list can include the URL response data and the embedded URL data. In some embodiments, the identification of the embedded response object data can be dependent upon the capabilities of the user agent 102 and/or client device 104.

When the response object data is a URL, generator 242 can analyze the URL to determine if the URL includes a fully qualified domain name (FQDN) different from an FQDN associated with the URL of the request data The FQDN associated with the URL of the request data is copied by the OS 110 prior to transmitting the request data to content server 114. In this exemplary embodiment, the FQDN of the URL is different and, consequently, the generator 242 queries (512) the DNS server 120. The generator 242 transmits the different FQDN to the DNS server 120 and the DNS server 120 returns mapping data associated with the different FQDN to the generator 242. The mapping data (e.g., IP address) maps the different FQDN to the IP address associated with the different FQDN.

After the generator 242 has received the mapping data from the DNS server 120, generator 242 forwards (514) optimized data to the client device 104. In this exemplary embodiment, the optimized data can include, among other things, the response data, the response object list identifying the response object data, and the mapping data associated with the response object data. The response monitor 218 of the client device 104 receives the optimized data and separates the optimized data into the response data, the response object list, and the mapping data.

After the optimized data has been separated, the response monitor 218 can transmit (516) the response data to the rendering engine 204 of the user agent 102 so that a user can view the web page that was originally requested. Further, the response monitor 218 transmits (518) the mapping data to the DNS cache 220 wherein the DNS cache stores the mapping data for a configurable amount of time. When the user agent 102 requests the mapping data corresponding to an FQDN of the object data, the client device 104 can refer to the DNS cache without having to transmit the request through a gateway or proxy to the DNS server 120. In some embodiments, if the mapping data cannot be extracted and stored in the DNS cache 220, the DNS cache 220 can be communicatively coupled to the DNS server 120 so that the DNS cache can retrieve the particular mapping data from the DNS server 120.

Figure 7:
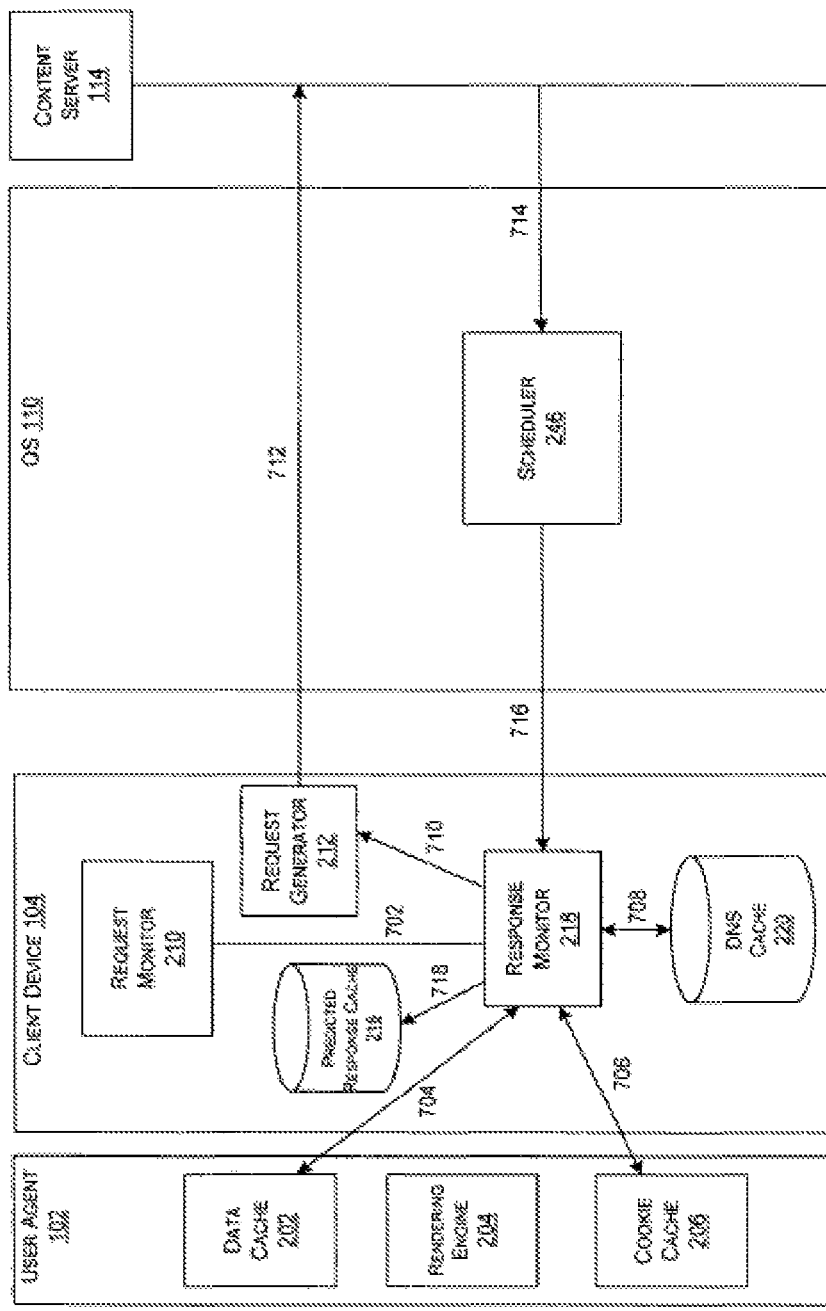
FIG. 7 is a functional diagram illustrating an exemplary method for processing object data in the response object list.

Additionally, the response monitor 218 can process the response object list by storing (520) a predicted response data and predicted request data identifying the predicted response data in the predicted response cache 216. Regarding the predicted response data, once a request monitor receives a subsequent request from a user agent, the request monitor can query the predicted response cache 216 for any predicted response data that corresponds to the subsequent request and forward the predicted response data to the user agent without having to query the content server with the subsequent request data. The processing of the response object list can be the exemplary processing method illustrated in FIG. 7 as now explained. The response monitor 218 can determine whether the response object data (e.g., embedded URLs of the requested URL, etc.) is currently being downloaded per a user agent request or due to another client object prediction by contacting (702) the request monitor. The request monitor 210 can determine which response object data is outstanding because all request data is transmitted through it. In some embodiments, request monitor 210 check the predicted response cache 216 to determine whether any predicted response data has been downloaded. If so, the response monitor 218 can skip this response object data and process the next response object data within the response object list.

If not, the response monitor 218 can communicate (704) with the data cache 202 of the user agent 102 to determine if the data cache 202 has a fresh entry of stored object data that corresponds to the response object data. If the object data is stored in the data cache 202 and the stored object data is fresh, the response monitor 218 can skip this response object data and process the next object data. The user agent 102 can then retrieve the stored object data from the data cache 202. If the stored object data corresponding to the response object data is stored in the data cache but is stale, response monitor 218 can retrieve freshness data from the freshness cache (not shown) about how stale the response object data is to be used later. If the stored object data corresponding to the response object data is not located at the data cache, the response monitor 218 can continue processing the response object data. Consequently, at this time, response monitor 218 has determined whether the response object data has been downloaded or if "fresh" stored object data corresponding to the response object data has been located in the data cache 202 of the user agent 102. If the response monitor has determined that the response object data has been downloaded or "fresh" object data has been stored at the data cache 202, the processing of the object data on the response object list can end.

Otherwise, if the response object data has not been downloaded, the object data stored in the data cache 202 is stale, or the object data corresponding to the response object data is not stored in the data cache, response monitor 218 can query (706) cookie cache 206 for any existing cookie data associated with the response object data. Further, the response monitor 218 can request (708) the DNS cache 220 for any existing mapping data associated with the particular response object data.

Response monitor 218 forwards (710) the response object data (e.g., embedded URLs within the response object list that have yet to be downloaded from content server) along with any existing cookie and mapping data associated with the response object data to request generator 212. Request generator 212 uses the response object data along with any existing cookie and mapping data associated with the response object data to mimic an HTTP request from the user agent. Further, the request generator 212 can generate a user agent string and other HTTP request headers to mimic, as closely as possible, what the user agent 102 expects to issue when it transmits request data to the content server 114. Furthermore, the HTTP request is flagged as predicted request data for OS 110.

Request generator 212 can forward (712) the predicted request data through OS 110 to content server 114. Content server 114 transmits (714) predicted response data (e.g., response data of the embedded URLs that were located in the response object list) to OS 110.

After the OS 110 receives the predicted response data from the content servers 114, scheduler 246 can determine the scheduling method to give preferences to some data over others. For example, the scheduler 246 may give preferences to response data associated with the request data from user agent 102 over predicted response data from request generator 212. Another example may include scheduler 246 giving preferences to response object data appearing earlier in the response data over response object data appearing later in the response data. The scheduler can forward (716) the predicted response data to response monitor 218. Response monitor 218 can transmit (718) the predicted response data (e.g., response data of the embedded URLs alone or in combination with cookie data and mapping data) to the predicted response cache 216, which stores the predicted response data for a configurable amount of time.

Consequently, for example, when the user agent 102 transmits subsequent request data, request monitor 210 can intercept the request data. Request monitor 210 can request the predicted response cache 216 for any predicted response data that corresponds to the request data. Request monitor's request can be based on a matching algorithm that can include the request object data (e.g., URLs), the cookie data associated with the request object data, the cache parameters, the user agent that is doing the requesting, etc. The predicted response cache can forward any matched data to request monitor 210. If the request data matches any predicted response data, request monitor 210 can forward the predicted response data to user agent 102 through request monitor 210. Otherwise, if the request data does not match any predicted response data, the request monitor 210 can forward the request data through OS 110 to content server 114 in a similar manner described above.

Figure 6:
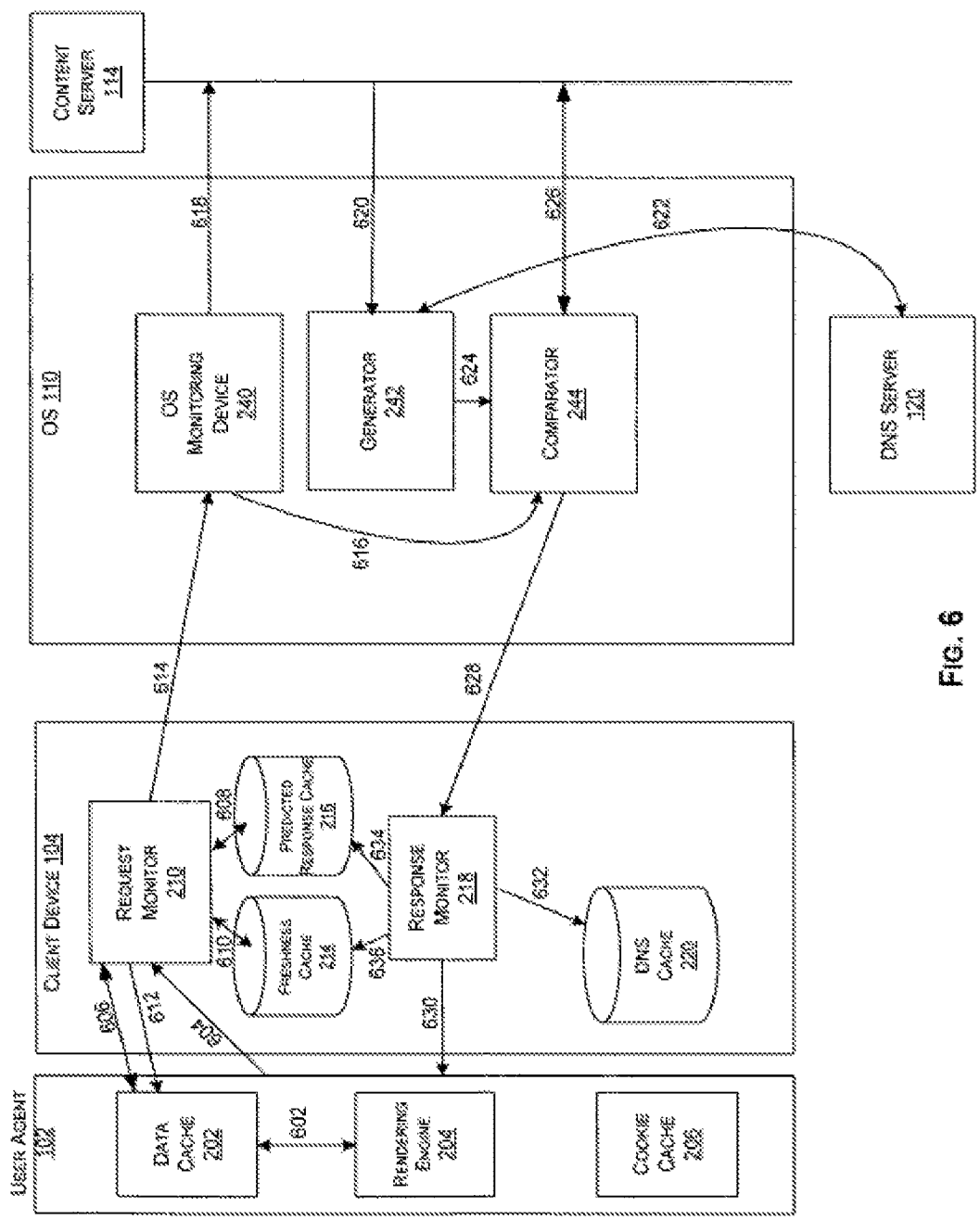
FIG. 6 is a functional diagram illustrating an exemplary communication flow in the exemplary system of FIG. 4.

FIG. 6 is a functional diagram illustrating an exemplary communication flow in the system of FIG. 4. It is assumed for the purposes of explaining this exemplary communication flow that when a web page is first requested by the rendering engine 204, some of the HTML content data of the web page resides in the data cache 202 of the user agent 102 and the stored HTML content data is stale. In addition, while a single content server 114 has been displayed for simplicity purposes, any number of content servers could be provided. A user inputs a URL into a user agent 102. The user agent passes this request to the rendering engine 204. Rendering engine 204 queries (602) the data cache 202 for any content data relating to the URL and the data cache 202 determines that at least some of the content data is stale. In some embodiments, rendering engine 204 can also query cookie cache 206 and append any retrieved data to the request. The user agent 102 transmits (604) the request data to the client device 104.

After the client device 104 has received the request data (e.g., HTTP request of the URL), the request monitor 210 queries (606) the data cache 202 of the user agent 102. In some embodiments, request monitor 210 does not query the data cache 202 because user agent 102 has provided the embedded request object data along with the request data. Based on the query, the request monitor generates a request object list that identifies embedded request object data within the request data. In some embodiments, request monitor 210 can further query data cache 202 and cookie cache 206 for any freshness data and cookie data associated with the request object data. The freshness and cookie data can be provided in the request object list. The identification of the request object data can be dependent on the client device 104 and the user agent 102. For example, while some user agents display all request object data of a web page, other user agents try to intelligently render the web page onto a small screen. This intelligent rendering may only download a subset of embedded request object data within the webpage. Consequently, the parsing performed may consider these intelligent rendering techniques for each client device and each user agent.

Request monitor 210 queries (608) the predicted response cache 216 to determine if the request object data that is to be downloaded matches any stored predicted request data that identifies the predicted response data. For example, the request monitor 210 can send to the predicted response cache 216, among other things, URL data, cookie data, cache parameter data, and user agent data. If any stored predicted request data matches this sent data, the predicted response cache 216 can transmit back to the request monitor 210 the predicted response data that has been identified by the matched stored predicted request data.

Additionally, the request monitor 210 can query (610) the freshness cache 214 for any freshness data concerning stale request object data to determine if any stale object data listed on the request object list is in fact "fresh" stale object data. For example, request monitor 210 has a URL listed as being stale and forwards at least the URL data to the freshness cache 214 and the freshness data provides to the request monitor 210 any updated freshness data for that particular URL. If the predicted response cache 216 or the freshness cache provides any predicted response data or updated freshness data, the request object list can be updated with this data and the response monitor 210 can forward (612) the predicted response data and/or updated freshness data to the data cache 202 of the user agent 102. The data cache 202 can be updated with the updated freshness data and/or the predicted response data.

If the request object list includes any request object data marked to be downloaded, the request monitor 210 can forward (614) the request data to the OS 110. The request data may include the request object list from the request monitor 210.

OS monitoring device 240 of the OS 110 receives the request data from the client device, analyzes the request data, and determines whether the request data has been transmitted from either a user agent (e.g., user agent 102) or a client device (e.g., client device 104) that contains the client hardware/software having the necessary capabilities. Furthermore, if the request object list has been appended to the request data, OS monitoring device 240 can extract the request object list from the response data and forward (616) the request object list to comparator 244. OS monitoring device 240 can forward (618) the request data (without the appended data) to the appropriate content server 114. Consequently, the content server 114 provides (620) response data associated with the request data to the generator 242 of the OS 110.

After generator 242 has received the response data, generator 242 analyzes the response data to determine if the response data includes references to embedded response object data that the rendering engine 204 would have to download. For example, a GIF image might be compressible by the proxy, but it does not contain references to other object data that a web browser would have to download, while a markup language can have references to other object data that the web browser would have to download. The generator 242 can parse through the response data and can create a response object list identifying the request object data and the FQDN of the request object data. In some embodiments, the identification of the embedded object data can be dependent upon the capabilities of the user agent 102 and/or client device 104.

When the response object data is a URL, generator 242 can analyze the URL to determine if the URL includes an FQDN different from the FQDN associated with the URL provided in the request object list. The FQDN associated with the URL of the request object list is copied by the OS 110 and provided to generator 242 prior to transmitting the request data to content server 114. In this exemplary embodiment, the FQDN is different and, consequently, the generator 242 queries (622) the DNS server 120. Generator 242 transmits the different FQDN to DNS server 120 and DNS server 120 returns the corresponding mapping data to generator 242. The mapping data maps the different FQDN to the IP address associated with the different FQDN.

After the generator 242 has received any existing mapping data, generator 242 can forward (624) the response data, the mapping data, and the response object list to the comparator 244. Comparator 244 compares each request object data on the request object list with each response object data on the response object list. If the response object data matches the request object data and the matched request object data is fresh, the comparator 244 can delete the response object data from the response object list because the response object data is not to be downloaded. Alternatively, in some embodiments, the response object data from the response object list can be marked as not being downloaded instead of being deleted from the response object list. If the response object data does not have a corresponding match in the request object list, comparator 244 can update the response object list to include information that this particular response object data is to be downloaded. If the response object data matches the request object data and the matched request object data is stale, the comparator 244 can determine if the request object data is truly stale by requesting the content server to verify the freshness of the request object data. The response data from content server 114 has the ability to inform comparator 244 if the content is stale, by either responding with new object data or by informing the comparator 244 that the current version is fresh. Comparator 244 transmits the request for verification along with the current "timestamp" of the object data to content server 114 so that the content server 114 can compare the timestamp information. If the content server verifies that the request object data is stale, comparator 244 can update the response object list to include information that this particular response object data is to be downloaded. If the content server verifies that the alleged stale request object data is indeed fresh ("fresh" stale object data), comparator 244 can update the response object list to include information that this particular response data object is not to be downloaded. Comparator 244 updates the response object list based on each request object data.

After the comparator has updated the response object list, comparator 244 can query (626) the content server by providing the response object data and receiving response data of the response object data that is to be downloaded to user agent 102. The comparator 244 forwards (628) optimized data to the client device 104. In this exemplary embodiment, the optimized data can include, among other things, the response data from content server 114, the response object list, the mapping data, the response data associated with the response object data to be downloaded to user agent, and the freshness data of the "fresh" stale content data. In some embodiments, comparator can transmit each group separately.

The response monitor 218 of the client device 104 receives the optimized data, separates the optimized data, and processes the separated data accordingly. The optimized data is separated into the response data, the response object list, the mapping data, the response data associated with the response object data to be downloaded to user agent, and the freshness data of the "fresh" stale content data.

After the optimized data has been separated, the response monitor 218 transmits (630) the response data to the user agent 102, which can store the response data and/or upload the response data into rendering engine 204. Further, the response monitor 218 transmits (632) the mapping data to DNS cache 220, which stores the mapping data for a configurable amount of time. When user agent 102 requests an FQDN, client device 104 or the user agent itself can refer to the DNS cache without having to transmit the request through a gateway or proxy to the DNS server 120. In some embodiments, if the mapping data cannot be extracted and stored in the DNS cache 220, the DNS cache 220 can be communicatively coupled to the DNS server 120 so that the DNS cache can retrieve the particular mapping data from the DNS server 120. Furthermore, the response monitor 218 forwards (634) the response data corresponding to the request object data to predicted response cache 216 so that this response data can be stored for a configurable amount of time. When the user agent determines that additional embedded data corresponding to the URL response is needed from content server to complete the web page at user agent, user agent can transmit a subsequent request requesting response data corresponding to the request object data. Because the client device has this response data corresponding to the request object data (predicted response data), the client device can provide the predicted response data to the user agent without having to access the content server for this subsequent request. Also, the response monitor 218 processes the freshness data of the "fresh" stale object data by forwarding (636) the freshness data to freshness cache 214. Alternatively, in some embodiments, the freshness data can be forwarded to data cache 202 of the user agent 102 to instruct the data cache 202 that the stale object data of the content data is indeed fresh.

Additionally, the response monitor 218 can process the response object list. Regarding the predicted response data, once a client device receives a subsequent request from a user agent, the client device can query the predicted response cache 216 for any predicted response data that corresponds to the subsequent request and forwards the predicted response data to the user agent without having to query the content server with the subsequent request data. The processing of the response object list can be the processing method illustrated in FIG. 7. The response monitor 218 can determine whether the response object data (e.g., URL, etc.) is currently being downloaded per a user agent request or due to another client object prediction by contacting (702) the request monitor. The request monitor 210 can determine which response object data is outstanding because all request data is transmitted through it. In some embodiments, request monitor 210 checks the predicted response cache 216 to determine whether any predicted response data has been downloaded. If so, the response monitor 218 can skip this response object data and process the next response object data within the response object list.

If not, the response monitor 218 can communicate (704) with the data cache 202 of the user agent 102 to determine if the data cache 202 has a fresh entry of stored object data that corresponds to the response object data. If the object data is stored in the data cache 202 and the stored object data is fresh, the response monitor 218 can skip this response object data and process the next object data. The user agent 102 can then retrieve the stored object data from the data cache 202. If the stored object data corresponding to the response object data is stored in the data cache but is stale, response monitor 218 can retrieve freshness data from the freshness cache about how stale the response object data is to be used later. If the stored object data corresponding to the response object data is not located at the data cache, the response monitor 218 can continue processing the response object data. Consequently, at this time, response monitor 218 has determined whether the response object data has been downloaded or if "fresh" stored object data corresponding to the response object data has been located in the data cache

202 of the user agent 102. If the response monitor has determined that the response object data has been downloaded or "fresh" object data has been stored at the data cache 202, the processing of the object data on the response object list can end.

Otherwise, if the response object data has not been downloaded, the object data stored in the data cache 202 is stale, or the object data corresponding to the response object data is not stored in the data cache, response monitor 218 can query (706) cookie cache 206 for any existing cookie data associated with the response object data. Further, the response monitor 218 can request (708) the DNS cache 220 for any existing mapping data associated with the particular response object data.

Response monitor 218 forwards (710) the response object data along with any existing cookie and mapping data associated with the response object data as well as freshness data to request generator 212. Request generator 212 uses the response object data along with any existing cookie and mapping data associated with the response object data to mimic an HTTP request from the user agent. Further, the request generator 212 can generate a user agent string and other HTTP request headers to mimic, as closely as possible, what the user agent 102 expects to issue when it transmits request data to the content server 114. Furthermore, the HTTP request is flagged as predicted request data for OS 110.

Request generator 212 can forward (712) the predicted request data through OS 110 to content server 114. Content server 114 transmits (714) predicted response data (e.g., response data of the embedded URLs that were located in the response object list) to OS 110.

After the OS 110 receives the predicted response data from the content servers 114, scheduler 246 can determine the scheduling method to give preferences to some data over others. For example, the scheduler 246 may give preferences to response data associated with the request data from user agent 102 over predicted response data from request generator 212. Another example may include scheduler 246 giving preferences to response object data appearing earlier in the response data over response object data appearing later in the response data. The scheduler can forward (716) the predicted response data to response monitor 218. Response monitor 218 can transmit (718) the predicted response data (e.g., response data of the embedded URLs alone or in combination with cookie data and mapping data) to the predicted response cache 216, which stores the predicted response data for a configurable amount of time.

Consequently, for example, when the user agent 102 transmits subsequent request data, request monitor 210 can intercept the request data. Request monitor 210 can request the predicted response cache 216 for any predicted response data that corresponds to the request data. Request monitor's request can be based on a matching algorithm that can include the request object data (e.g., URLs), the cookie data associated with the request object data, the cache parameters, the user agent that is doing the requesting, etc. The predicted response cache can forward any matched data to request monitor 210. If the request data matches any predicted response data, request monitor 210 can forward the predicted response data to user agent 102 through request monitor 210. Otherwise, if the request data does not match any predicted response data, the request monitor 210 can forward the request data through OS 110 to content server 114 in a similar manner described above.

Figure 8:
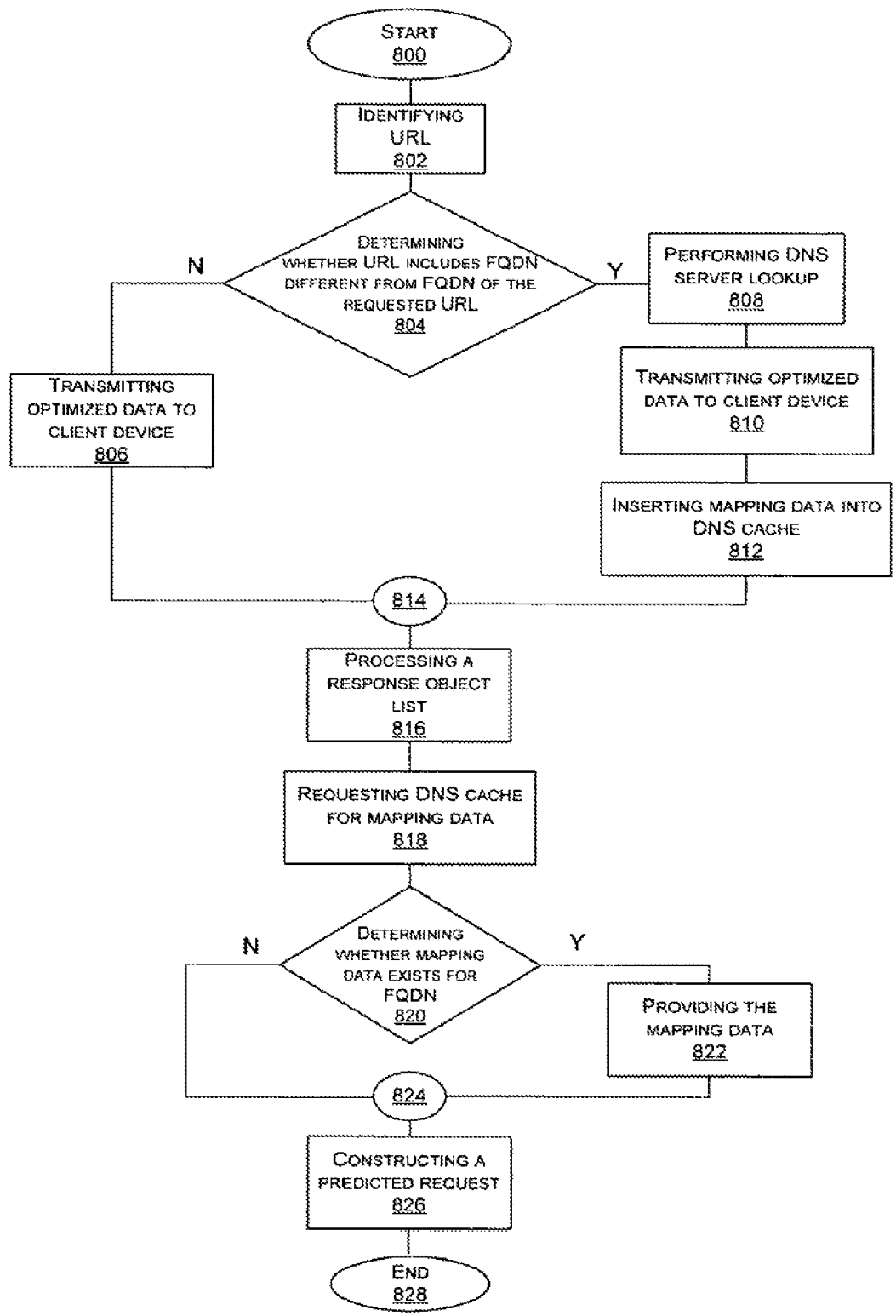
FIG. 8 is a flowchart representing an exemplary method for DNS optimization.

FIG. 8 is a flowchart representing an exemplary method for DNS optimization. It will be readily appreciated by one of ordinary skill in the art that the illustrated procedure can be altered to delete steps or further include additional steps. After initial start step 800, an OS can identify (802) URLs associated with response data from a content server and store these URLs in a response object list.

Once the OS has identified the URLs, the OS can determine (804) whether each URL includes an FQDN different from an FQDN associated with the URL of a request data. If the OS determines that the FQDN is the same, the OS transmits (806) optimized data to the client device and the method can proceed to connector 814. On the other hand, if the OS determines that at least one response URL has an FQDN different from the FQDN of the requested URL, OS performs (808) a DNS lookup from a DNS server. OS provides the FQDN data to the DNS server and the DNS server provides an IP address associated with the provided FQDN to the OS based on the FQDN data thereby creating mapping data that maps the FQDN to the IP address. In some embodiments, performing step 808 is controlled by the capabilities of a client device or the user agent. For example, the capabilities of the client device can be explicitly relayed to the OS via communication from the client device or implicitly relayed to the OS via a user agent string.

After the OS has performed the DNS lookup, the OS transmits (810) optimized data, which includes the mapping data, to the client device. In some embodiments, the mapping data can be transmitted separately from the optimized data. Once the client device receives the optimized data, the client device can extract the mapping data and insert (812) the mapping data into a DNS cache and the method can proceed to connector 814. The DNS cache can be located in the user agent or the client device.

The method proceeds from connector 814 to the client device processing (816) the response object list, which includes one or more URLs. When processing a URL on the response object list, the client device can request (818) the DNS cache for any mapping data associated with an FQDN of the particular URL. As a result, the DNS cache determines (820) whether the mapping data (e.g., IP address) exists for the FQDN of the particular URL. If the mapping data does not exist, the method proceeds to connector 824. If the mapping data exists, the DNS cache provides (822) mapping data to either the user agent or the client device and the method proceeds to connector 824.

The method proceeds from connector 824 to the client device constructing (826) a predicted request data where the construction includes, among other things, URLs and any existing mapping data, which correspond to the URLs, provided by the DNS cache. In some embodiments, the construction can also include cookie data associated with the URLs from a cookie cache of the user agent. After the constructing step 826, the method can end (828).

Figure 9B:
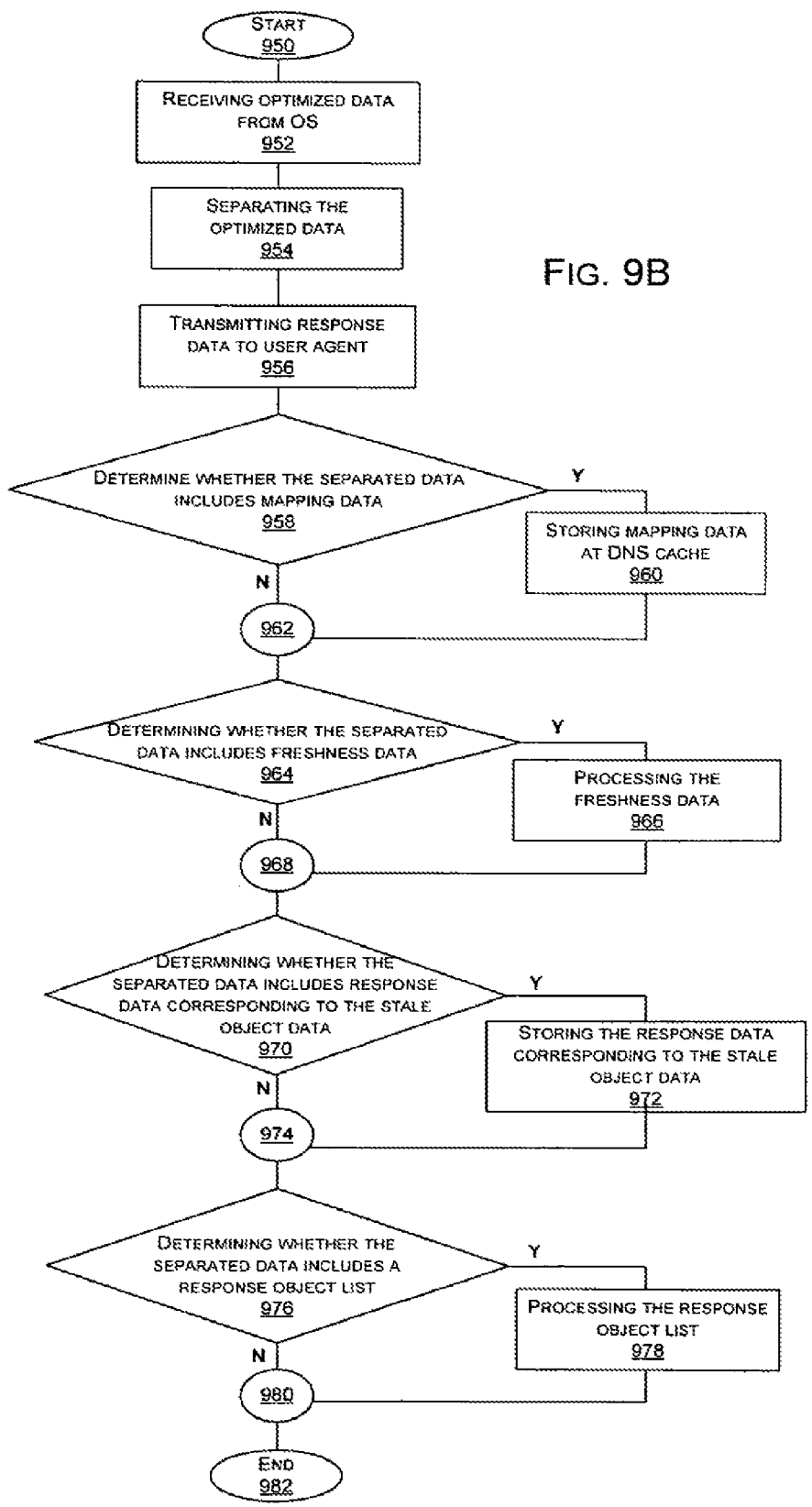

FIGS. 9A and 9B are flowcharts representing exemplary methods for providing object prediction at a user agent and a client device. Referring to FIG. 9A, it will be readily appreciated by one of ordinary skill in the art that the illustrated procedure can be altered to delete steps or further include additional steps. While the exemplary method provided in FIG. 9A is tailored more towards a client device, it is readily appreciable that the exemplary method can be performed in part or exclusively by a user agent. After initial start step 900, a user requests (902) a web page from a user agent.

After the web page has been requested, the user agent determines (904) whether the content data of the request is stored in a data cache located at the user agent. For example, the content data can be markup language content data of a requested web page wherein the markup language can be HyperText Markup Language (HTML), Extensible HTML (XHTML), Wireless Markup Language (WML), etc. If the content data is not stored, the user agent can forward (906) the request data (e.g., HTTP request of the URL), which includes the requested content data, to the content server and then proceed to connector 940. In some embodiments, the client device intercepts the request data and then forwards the request data to the content servers. On the other hand, if the content data is stored, the user agent determines (908) whether all content data is fresh or stale. If the content data is fresh, the user agent provides (910) the fresh content data to the rendering engine and the method proceeds to connector 940. If some of the content data is stale, the client device can identify (912) embedded request object data (e.g., embedded URLs within the HTTP request of URL) associated with the content data and place all identified object data on a request object list. For example, the object data can include one or more URLs.

After the identification, the client device can query (916) the data cache by providing the request object data and receiving any freshness data of the object data stored at the data cache of the user agent. The user agent can determine (918) whether the stored object data is fresh. If the stored object data is fresh, the corresponding request object data on the request object list is marked (920) as being fresh and the method proceeds to connector 926. On the other hand, if the stored object data is stale or not present at the data cache, the client device retrieves (922) any relevant data related to this object data. For example, the relevant data may include any cookie data or any freshness data associated with the object data only if the content data is in the data cache and is stale. After the retrieval of any relevant data, the corresponding request object data on the request object list is marked (924) accordingly. The request object data is marked stale if the corresponding stored object data is found to be stale or is marked to be downloaded if the stored object does not exist. After the marking, the method can proceed to connector 926.

The client device can then determine (928) whether there is any additional embedded request object data. If so, the method proceeds to connector 914. Otherwise, the method proceeds to determine (930) whether the request object data that is marked as being stale or to be downloaded on the request object list matches stored predicted request data in a predicted response cache. For example, the match can occur when the request object data, the cookie data of the request object data, the data cache parameters, and the user agent are similar or the same between the request object data and the stored predicted request data. If not, the method proceeds to connector 936. Otherwise, if a match occurs, the client device updates (932) the request object list by marking this request object data to not be downloaded. Further, the client device provides (934) to the user agent the predicted response data that has been identified by the matched stored predicted request data. In some embodiments, the stored predicted response data can include freshness and mapping data. The user agent can store this stored predicted response data in the data cache or provide it to the web browser. The method then proceeds to connector 936.

Client device can then forward (938) the request data, which can include the request object list, to the OS. The method can proceed to connector 940 and then end (942).

Referring to FIG. 9B, it will be readily appreciated by one of ordinary skill in the art that the illustrated procedure can be altered to delete steps or further include additional steps. While the exemplary method provided in FIG. 9B is tailored towards a client device, it is readily appreciable that the exemplary method can be performed in part or exclusively by a user agent. After initial start step 950, the client device receives (952) optimized data from an OS. The optimized data can include, among other things, response data associated with a request data, response object list identifying request object data, any mapping data, any freshness data of a "fresh" stale object data, and response data corresponding to a stale request object data.

After the client device has received the optimized data, the client device can separate (954) the optimized data based on the type of data included within. For example, the optimized data can be separated based on whether the data is response data provided by the content server, a response object list, any mapping data, any freshness data of the "fresh" stale object data, and response data corresponding to the stale request object data.

The client device can transmit (956) to the user agent the response data that has been provided by the content server. Further, the client device can determine (958) whether the separated optimized data includes any mapping data. If not, the method proceeds to connector 962. Otherwise, if the separated optimized data includes mapping data, the client device stores (960) the mapping data at a DNS cache within a client device for future referencing. If the user agent requests a DNS query, a client device could look up the mapping data in the DNS cache without having to query a remote DNS server. In some embodiments, determining step 958, storing step 960, and connector 962 can be moved to any point on the flowchart as long as they are after separating step 954.

Furthermore, the client device can determine (964) whether the separated optimized data includes any freshness data. If not, the method proceeds to connector 968. Otherwise, if the separated optimized data includes freshness data, the client device processes (966) the freshness data of a "fresh" stale object data by storing this freshness data in a freshness cache for future referencing. For example, if a user agent requests object data that it has determined to be stale, the client device can perform a freshness lookup at the freshness cache and, if any freshness data corresponds to the stale request object data, the client device can inform the user agent that the stale object data is indeed fresh. In some embodiments, instead of the client device having a freshness cache, the client device can notify the user agent that the request object data is indeed fresh and the user agent can update its data cache to show that the stored object data is fresh. In some embodiments, determining step 964, processing step 966, and connector 968 can be moved to any point on the flowchart as long as they are after separating step 954.

Additionally, the client device can determine (970) whether the separated optimized data includes any response data that was downloaded because the object data was determined to be stale ("stale" response data). If not, the method proceeds to connector 974. Otherwise, if the separated optimized data includes any "stale" response data, the client device stores (972) the "stale" response data in a predicted response cache for future referencing. This "stale" response data For example, if a user agent requests object data that it has determined to be stale, the client device can perform a request data lookup at the predicted response cache by providing requested object data and, if any stored predicted request data matches the provided request object data, the predicted response cache provides predicted response data (stored "stale" response data), which cross references to the stored predicted request data, to the user agent. The user agent can display this "stale" response data at the web browser or store this "stale" response data in its data cache. In some embodiments, determining step 970, storing step 972, and connector 974 can be moved to any point on the flowchart as long as they are after separating step 954.

Also, the client device can determine (976) whether the separated optimized data includes a response object list. If not, the method can proceed to connector 980 and the method can end (982). Otherwise, if the separated optimized data includes a response object list, the client device can process (978) the response object list, such as the exemplary processing method shown below in FIG. 12. In some embodiments, determining step 976, processing step 978, and connector 980 can be moved to any point on the flowchart as long as they are after separating step 954. The method can then proceed to end (982).

Figure 12:
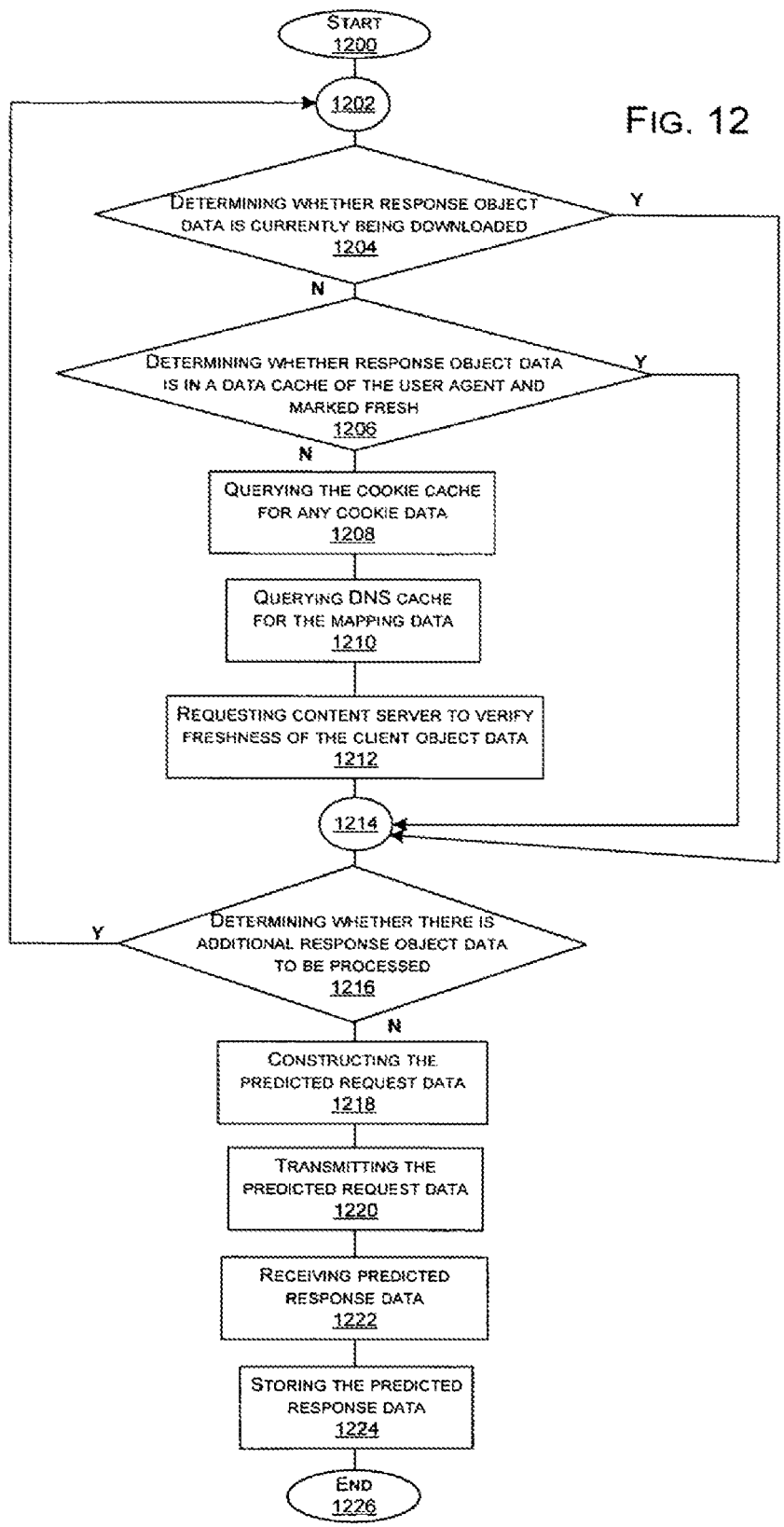
FIG. 12 is a flowchart providing an exemplary method for processing a response object list.

For example, FIG. 12 provides an exemplary method for processing the response object list. It will be readily appreciated by one of ordinary skill in the art that the illustrated procedure can be altered to delete steps or further include additional steps. While the exemplary method provided in FIG. 12 is tailored towards a client device, it is readily appreciable that the exemplary method can be performed in part or exclusively by a user agent. After initial start step 1200, the client device determines (1204) whether the current response object data from response object list is currently being downloaded by a user agent request or another client prediction. For example, the response object list may include object data, such as URLs, and data relating to the object data such as freshness data and whether the object data needs to be downloaded. If the current response object data has been downloaded, the method proceeds to connector 1214. Otherwise, the client determines (1206) whether the response object data is located in a user agent and is marked in the user agent as being fresh. If so, the method proceeds to connector 1214.

Otherwise, if the response object data is neither located in the user agent nor is marked in the user agent as being fresh, client device queries (1208) a cookie cache for any cookie data associated with the response object data. Further, the client device queries (1210) the DNS cache for any mapping data associated with the response object data. Consequently, the client device can store (1212) any cookie or mapping data associated with the response object data.

After the client device has stored the cookie or mapping data, the client device determines (1216) whether there is any additional response object data to be processed. If so, the method proceeds to connector 1202. Otherwise, if there is no additional response object data to be processed for the response object list, the client device can construct (1218) the predicted request data that includes response object data and any cookie and mapping data related to the response object data. To try to predict a future request by a user agent, the client device tries to mimic the request as much as possible by using cookie data and mapping data. Further, the construction of the request may include mimicking a user agent string and other request header data, and/or flagging the request data as being a predicted request and not an actual request. Once the predicted request data has been constructed, the client device transmits (1220) the predicted request data to a content server.

After the client device has transmitted the predicted response data, the content server forwards the response data that is associated with the predicted request data (predicted response data), and the client device receives (1222) the predicted response data. Once the predicted response data has been received, the client device stores (1224) the predicted response data in a predicted response cache at the client device for a configurable amount of time. If the user agent requests data that is the same or is similar to the object data within the predicted response cache, the client device can return the predicted response data to the user agent, in some cases, without having to access the content servers thereby reducing bandwidth and latency. After the predicted response data has been stored, the method can end (1226).

Figure 10:
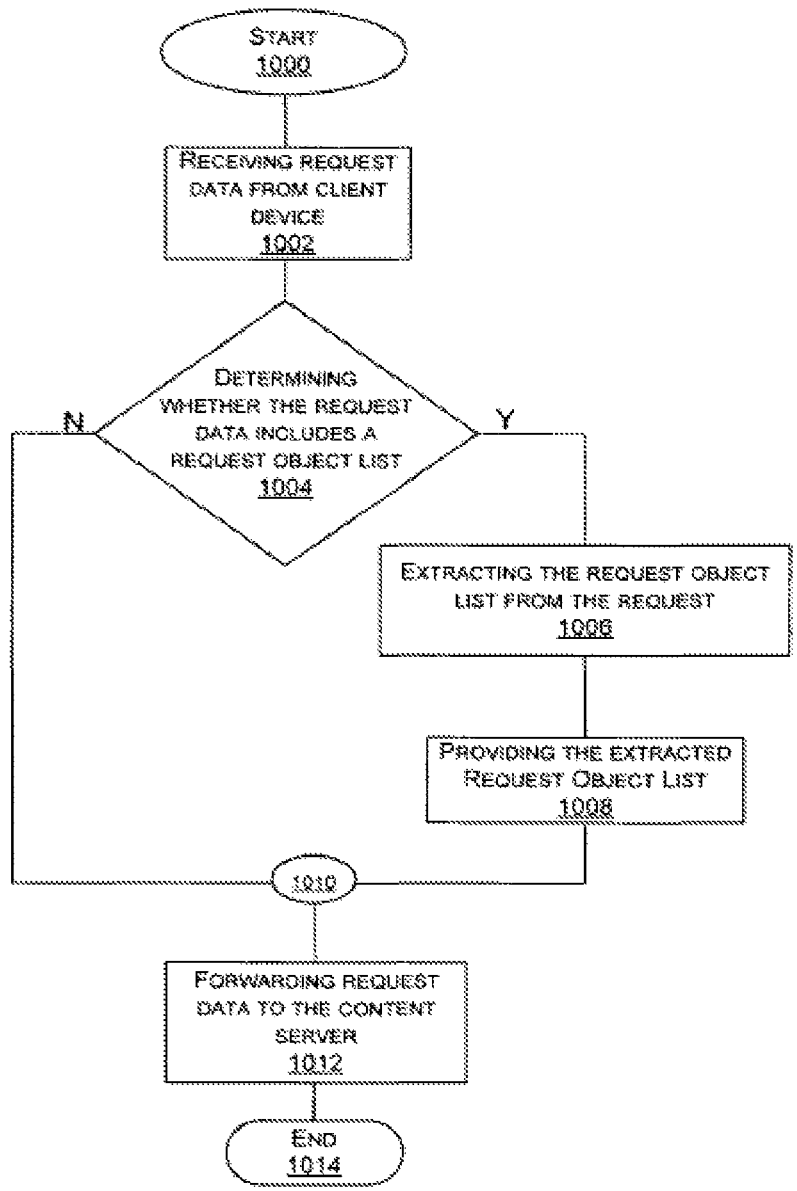
FIGS. 10 & 11 are flowcharts representing exemplary methods for providing object prediction at an optimization server.
Figure 11:
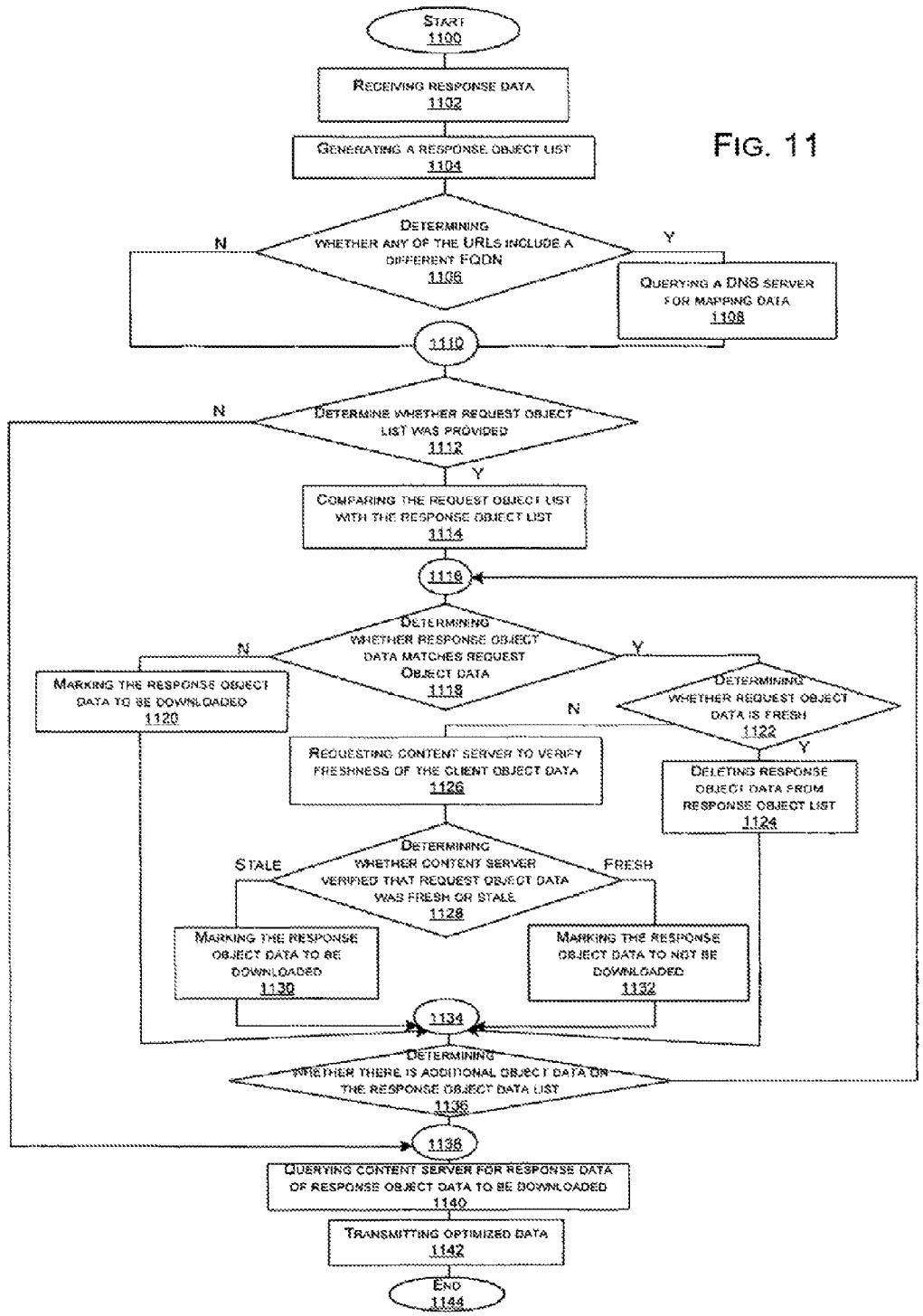

FIGS. 10 and 11 are flowcharts representing exemplary methods for providing object prediction at an OS. Referring to FIG. 10, it will be readily appreciated by one of ordinary skill in the art that the illustrated procedure can be altered to delete steps or further include additional steps. After initial start step 1000, the OS receives (1002) request data from the client device. In some embodiments, the request data may come from the user agent.

After the OS receives the request data, the OS can determine (1004) whether the request data includes a request object list. For example, the request object list may include request object data, such as URLs, and data relating to the request object data such as freshness data, FQDN of the request object data, and whether the request object data is to be downloaded. If the request data does not include the request object list, the method can proceed to connector 1010. Otherwise, if the request data does include the request object list, the OS can extract (1006) the request object list from the request data and provide (1008) the request object list to other hardware devices or software programs within the OS. For example, the provided request object list can correspond to the request object list determined to be provided in step 1112 in FIG. 11. The method can then proceed to connector 1010.

The OS can then forward (1012) the request data, without the request object list, to one or more contents servers. After the forwarding step 1012, the method can end (1014).

Referring to FIG. 11, it will be readily appreciated by one of ordinary skill in the art that the illustrated procedure can be altered to delete steps or further include additional steps. After initial start step 1100, an OS can receive (1102) response data from one or more content servers. For example, the response data can be the response data associated to the request data sent to the content server in step 1012 of FIG. 10.

After receiving the response data from the one or more content servers, the OS can generate (1104) a response object list based on the response data. The OS generates the response object list by analyzing the response data and parsing through the response data to identify the embedded response object data within the response data. For example, the response object data can include one or more URLS and the response data can be markup language content data of a requested web page wherein the markup language can be HyperText Markup Language (HTML), Extensible HTML (XHTML), Wireless Markup Language (WML), etc. For example, the response object list may include response object data, such as URLs, and data relating to the response object data such as freshness data, FQDN of the object data, and whether the response object data is to be downloaded.

After the generation, the OS can determine (1106) whether the response object data includes an FQDN different from an FQDN of the request object data provided. If the FQDN of the response object data is the same or similar to the FQDN of the request object data, the method can proceed to connector 1110. On the other hand, if the FQDN of the response object data is different from the FQDN of the request object data, the OS can query (1108) a DNS server by providing the FQDN and the DNS server can provide mapping data (e.g., an IP address) thereby providing the OS with mapping data that maps the FQDN to the IP address. The method can then proceed to connector 1110.

OS can determine (1112) whether the extracted request object list was provided. For example, the request object list may include request object data, such as URLs, and data relating to the request object data such as freshness data, FQDN of the request object data, and whether the object data is to be downloaded. If the extracted request object list was not provided, the method can proceed to connector 1138. Otherwise, if the extracted request object list was provided, the OS can compare (1114) the request object data within the request object list with the response object data within the response object list.

After the comparison, the OS determines (1118) whether a particular response object data matches any request object data. If there is not a match, the OS can mark (1120) the response object list that the particular response object data is to be downloaded and the method can proceed to connector 1134. On the other hand, if there is a match, the OS can determine (1122) whether the request object data that matches the response object data is fresh or stale. If the request object data is fresh, the OS can delete (1124) the matching response object data from the response object list and the method can proceed to connector 1134. Alternatively, in some embodiments, the OS can mark the response object list that the particular server object is not to be downloaded. If the request object data is stale, the OS can request (1126) the content server to verify the freshness of the request object data.

The OS can then determine (1128) whether the content server verified that the request object data was either fresh or stale. If the content server verified that the request object data was stale, the OS can mark (1130) the response object list that the particular response object data is to be downloaded and the method can proceed to connector 1134. Otherwise, if the content server verified that the request object data was fresh, the OS can mark (1132) the response object list that the particular response object data is not to be downloaded and the method can proceed to connector 1134.

Once the method has proceeded to connector 1134, the OS can determine (1136) whether there is any additional response object data that should be compared with any request object data. If so, the method proceeds to connector 1116. Otherwise, the method proceeds to connector 1138 and the OS can query (1140) the content server for any response data associated with the request object data that is to be downloaded to user agent. The OS provides the request object data that is to be downloaded to the user agent, if any exists, and the content server provides the corresponding response data. For example, this response data can be stored at the client device as predicted response data. After the querying, the OS can transmit (1142) optimized data to a client device or a user agent. The optimized data can include, among other things, the response data received from the content server and/or the response object list. In some embodiments, the optimized data can include any mapping data, any freshness data for the "fresh" stale object data, and/or response data corresponding to the request object data that is to be downloaded to the user agent. After transmitting the optimized data, the method can end (1144).

Servers and clients as described herein may comprise any device capable of processing information and sending and receiving information, including without limitation a personal computer, notebook computer, personal digital assistant, cellular telephone, pager, a standalone computer server, a blade server, a rack mounted server, or a group of any types of said servers.

Figure 13A:
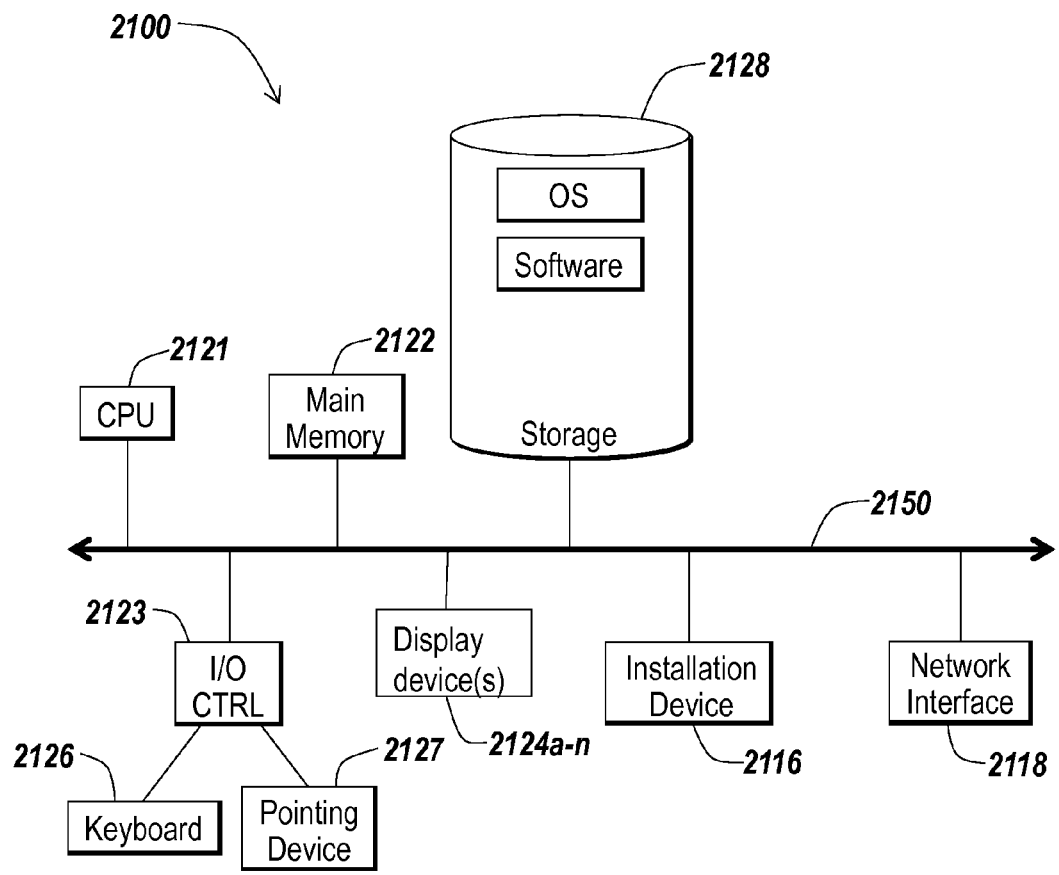
FIGS. 13A and 13B are block diagrams of embodiments of a computing or network device useful as a device in a client-server network.
Figure 13B:
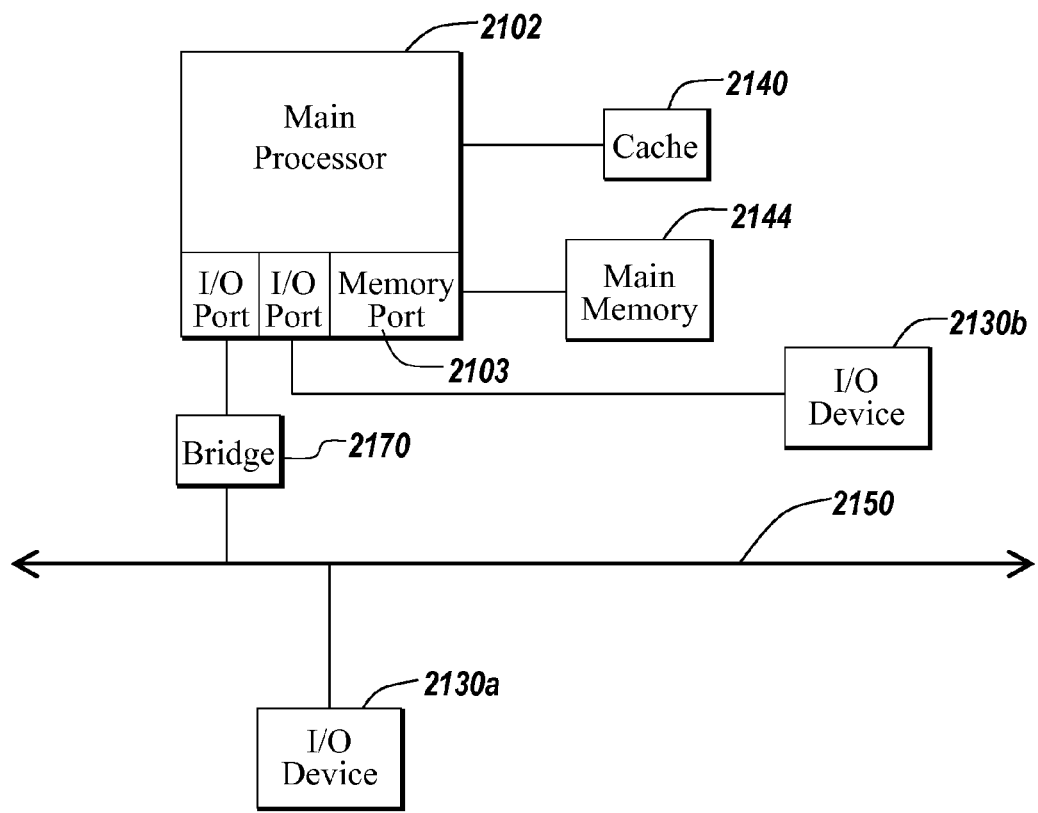

FIGS. 13A and 13B depict block diagrams of a typical computer 2100 useful as client computing devices and server computing devices. As shown in FIGS. 13A and 13B, each computer 2100 includes a central processing unit 2102, and a main memory unit 2104. Each computer 2100 may also include other optional elements, such as one or more input/output devices 2130*a*-2130-*b* (generally referred to using reference numeral 2130), and a cache memory 2140 in communication with the central processing unit 2102.

The central processing unit 2102 is any logic circuitry that responds to and processes instructions fetched from the main memory unit 2104. In many embodiments, the central processing unit is provided by a microprocessor unit, such as those manufactured by Intel Corporation of Mountain View, Calif.; those manufactured by Motorola Corporation of Schaumburg, Ill.; the Crusoe and Efficeon lines of processors manufactured by Transmeta Corporation of Santa Clara, Calif.; the lines of processors manufactured by International Business Machines of White Plains, N.Y.; or the lines of processors manufactured by Advanced Micro Devices of Sunnyvale, Calif.

Main memory unit 2104 may be one or more memory chips capable of storing data and allowing any storage location to be directly accessed by the microprocessor 2102, such as Static random access memory (SRAM), Burst SRAM or SynchBurst SRAM (BSRAM), Dynamic random access memory (DRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Enhanced DRAM (EDRAM), synchronous DRAM (SDRAM), JEDEC SRAM, PC100 SDRAM, Double Data Rate SDRAM (DDR SDRAM), Enhanced SDRAM (ESDRAM), SyncLink DRAM (SLDRAM), Direct Rambus DRAM (DRDRAM), or Ferroelectric RAM (FRAM). In the embodiment shown in FIG. 13A, the processor 2102 communicates with main memory 2104 via a system bus 2150 (described in more detail below). FIG. 13B depicts an embodiment of a computer system 2100 in which the processor communicates directly with main memory 2104 via a memory port. For example, in FIG. 13B the main memory 2104 may be DRDRAM.

FIGS. 13A and 13B depict embodiments in which the main processor 2102 communicates directly with cache memory 2140 via a secondary bus, sometimes referred to as a "backside" bus. In other embodiments, the main processor 2102 communicates with cache memory 2140 using the system bus 2150. Cache memory 2140 typically has a faster response time than main memory 2104 and is typically provided by SRAM, BSRAM, or EDRAM.

In the embodiment shown in FIG. 13A, the processor 2102 communicates with various I/O devices 2130 via a local system bus 2150. Various busses may be used to connect the central processing unit 2102 to the I/O devices 2130, including a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display, the processor 2102 may use an Advanced Graphics Port (AGP) to communicate with the display. FIG. 13B depicts an embodiment of a computer system 2100 in which the main processor 2102 communicates directly with I/O device 2130*b* via HyperTransport, Rapid I/O, or InfiniBand. FIG. 13B also depicts an embodiment in which local busses and direct communication are mixed: the processor 2102 communicates with I/O device 2130*a* using a local interconnect bus while communicating with I/O device 2130*b* directly.

A wide variety of I/O devices 2130 may be present in the computer system 2100. Input devices include keyboards, mice, trackpads, trackballs, microphones, and drawing tablets. Output devices include video displays, speakers, inkjet printers, laser printers, and dye-sublimation printers. An I/O device may also provide mass storage for the computer system 2128 such as a hard disk drive, a floppy disk drive for receiving floppy disks such as 3.5-inch, 5.25-inch disks or ZIP disks, a CD-ROM drive, a CD-R/RW drive, a DVD-ROM drive, tape drives of various formats, and USB storage devices such as the USB Flash Drive line of devices manufactured by Twintech Industry, Inc. of Los Alamitos, Calif.

In further embodiments, an I/O device 2130 may be a bridge between the system bus 2150 and an external communication bus, such as a USB bus, an Apple Desktop Bus, an RS-132 serial connection, a SCSI bus, a FireWire bus, a FireWire 800 bus, an Ethernet bus, an AppleTalk bus, a Gigabit Ethernet bus, an Asynchronous Transfer Mode bus, a HIPPI bus, a Super HIPPI bus, a SerialPlus bus, a SCI/LAMP bus, a FibreChannel bus, or a Serial Attached small computer system interface bus.

General-purpose computers of the sort depicted in FIG. 13A and FIG. 13B typically operate under the control of operating systems, which control scheduling of tasks and access to system resources. Typical operating systems include: MICROSOFT WINDOWS, manufactured by Microsoft Corp. of Redmond, Wash.; MacOS, manufactured by Apple Computer of Cupertino, Calif.; OS/2, manufactured by International Business Machines of Armonk, N.Y.; and Linux, a freely-available operating system distributed by Caldera Corp. of Salt Lake City, Utah, among others.

For embodiments comprising mobile devices, the device may be a JAVA-enabled cellular telephone, such as the i55sr, i58sr, i85s, or the i88s, all of which are manufactured by Motorola Corp. of Schaumburg, Ill.; the 6035 or the 7135, manufactured by Kyocera of Kyoto, Japan; or the i300 or i330, manufactured by Samsung Electronics Co., Ltd., of Seoul, Korea. In other embodiments comprising mobile devices, a mobile device may be a personal digital assistant (PDA) operating under control of the PalmOS operating system, such as the Tungsten W, the VII, the VIIx, the i705, all of which are manufactured by palmOne, Inc. of Milpitas, Calif. In further embodiments, the client may be a personal digital assistant (PDA) operating under control of the PocketPC operating system, such as the iPAQ 4155, iPAQ 5555, iPAQ 1945, iPAQ 2215, and iPAQ 4255, all of which manufactured by Hewlett-Packard Corporation of Palo Alto, Calif.; the ViewSonic V36, manufactured by ViewSonic of Walnut, Calif.; or the Toshiba PocketPC e405, manufactured by Toshiba America, Inc. of New York, N.Y. In still other embodiments, the mobile device is a combination PDA/telephone device such as the Treo 180, Treo 270, Treo 600, Treo 650, Treo 700, or the Treo 700w, all of which are manufactured by palmOne, Inc. of Milpitas, Calif. In still further embodiments, the mobile device is a cellular telephone that operates under control of the PocketPC operating system, such as the MPx200, manufactured by Motorola Corp. A typical mobile device may comprise many of the elements described above in FIGS. 13A and 13B, including the processor 2102 and the main memory 2104.

Figure 14:
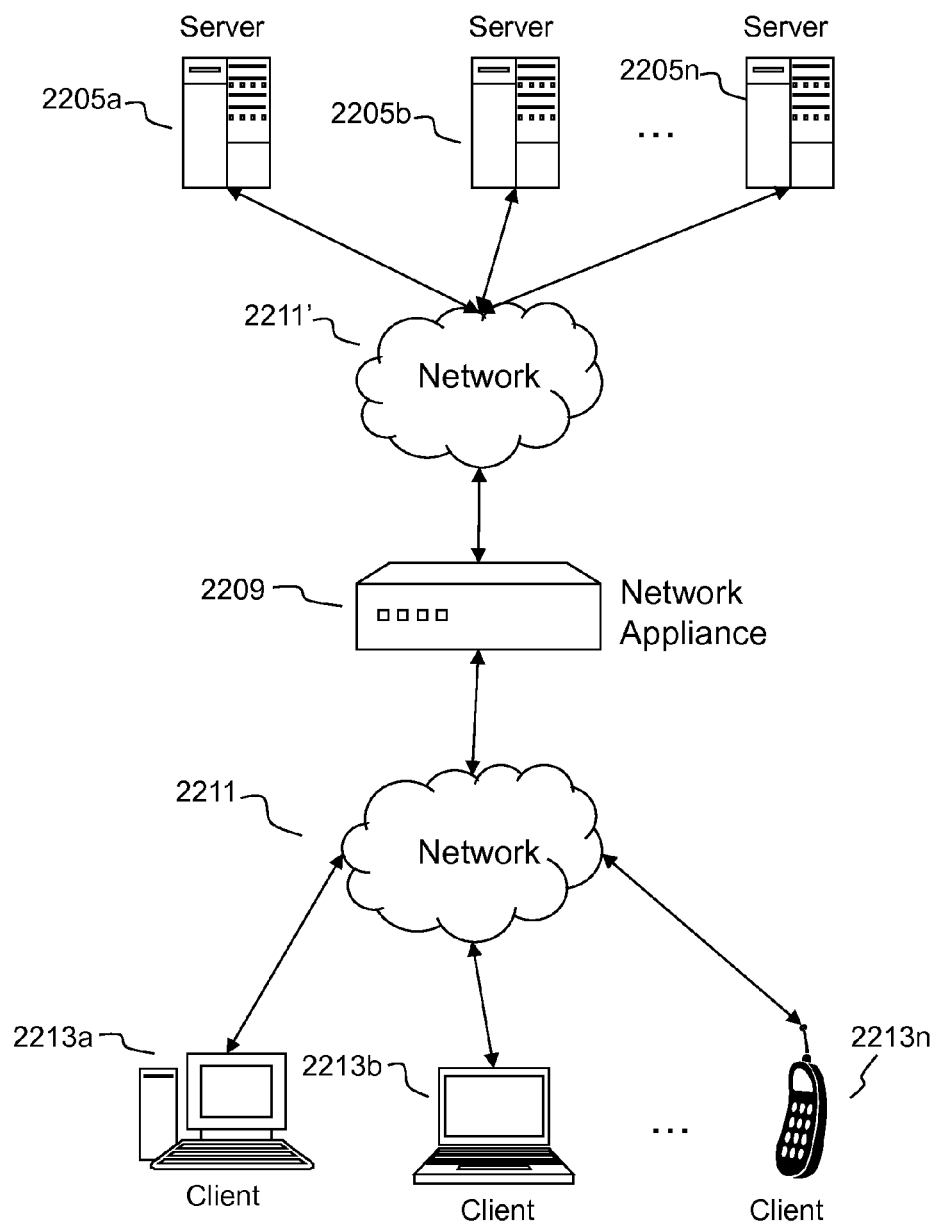
FIG. 14 is a block diagram illustrating an embodiment of a network appliance operating in a client-server network.

FIG. 14 depicts a block diagram illustrating an embodiment of a network appliance operating in a client-server network. In brief overview, a number of clients 2213a, 2213b, . . . 2213n' (collectively referred to as 2213), are connected via a network 2211, to a network appliance, 2209, which in turn is connected to a network 2211' comprising a number of servers 2205a, 2205b, 2205n (collectively referred to as 2205). The clients 2213, networks 2211, servers 2205, and network appliance 2209 may comprise any computing devices comprising substantially similar capabilities, descriptions, functions, and configurations as described herein.

For example, the network appliance may be or include any implementations of the optimization server 110 or gateway 106 described in connection with at least FIGS. 4-12. The network appliance 2209 may include any of the following of the optimization server 110: OS monitoring device 240, generator 242, comparator 244 and scheduler 246. The client 2213 may be or include any implementations of the client device 104 described at least in connections with Figured 4-12. As previously described, the client 2213 may include a user agent 102, data cache 202, rendering engine 204 and/or cookie cache 206. The client may include a request monitor 201, request generator 212, freshness cache 214, predicted response cache 216, response monitor 218 and DNS cache 220. The servers 2205 may be or include any implementations of the servers 114, 120 or gateway 106 described in connection with at least FIGS. 4-12.

Still referring to FIG. 14, in greater detail, a network appliance 2209 connected via a network 2211' to a number of servers 2205 is shown. In the embodiment shown, the servers 2205 may comprise any device capable of processing information and sending and receiving information, including a standalone computer server, a blade server, a rack mounted server, or a group of any types of said servers. The servers may further comprise databases, file servers, web servers, application servers or any other type of server. In embodiments involving multiple servers, the servers may be identical servers, or may differ in make, model, type, content, performance, availability, or any other aspect. The network appliance 2209 may perform any function related to providing services to clients 2213 including, without limitation, firewall services, SSL pooling and acceleration, TCP pooling and acceleration, data compression, connection monitoring, application logging, application acceleration, application delivery, load balancing, caching, virtualization, translation, redirection, connection pooling, proxy services, reverse proxy services, authentication, and session management. The network appliance 2209 may perform the functionality of any implementations of the optimization server 110 described in connection with at least FIGS. 4-12.

In some embodiments, the network appliance 2209 may reside on the same physical machine as the servers 2205. In some embodiments, the network appliance 2209 may share processors, disk space, RAM, or any other computing resource with the servers 2205.

In the embodiment shown, the network appliance 2209 is connected to networks 2211, 2211'. The networks 2211, 2211' may comprise the Internet, local networks, web servers, file servers, routers, databases, computers, servers, network appliances, or any other computing devices capable of sending and receiving information. The networks 2211, 2211' may comprise computing devices connected via cables, IR ports, wireless signals, or any other means of connecting multiple computing devices. The networks 2211, 2211' and any devices connected to the networks may communicate via any communication protocol used to communicate among or within computing devices, including without limitation SSL, HTML, XML, RDP, ICA, FTP, HTTP, TCP, IP, UDP, IPX, SPX, NetBIOS, NetBEUI, SMB, SMTP, Ethernet, ARCNET, Fiber Distributed Data Interface (FDDI), RS232, IEEE 802.11, IEEE 802.11a, IEE 802.11b, IEEE 802.11g and direct asynchronous connections, or any combination thereof. The networks 2211, 2211' may comprise mobile telephone networks utilizing any protocol or protocols used to communicate among mobile devices, including AMPS, TDMA, CDMA, GSM, GPRS or UMTS. The networks 2211, 2211' may comprise physically distinct networks, or the networks 2211, 2211' may comprise the same network, and may be connected in any manner. In some embodiments, the devices communicating via network 2211' may use a specialized or different protocol than devices communicating via network 2211.

In embodiments comprising a TCP/IP based communications among any of the above devices, any TCP/IP based protocol may be used, including Messaging Application Programming Interface (MAPI) (email), File Transfer Protocol (FTP), HyperText Transfer Protocol (HTTP), Common Internet File System (CIFS) protocol (file transfer), Independent Computing Architecture (ICA) protocol, Remote Desktop Protocol (RDP), Wireless Application Protocol (WAP), Mobile IP protocol, and Voice Over IP (VoIP) protocol. Any type and form of transport control protocol may also be used, such as a modified transport control protocol, for example a Transaction TCP (T/TCP), TCP with selection acknowledgements (TCPSACK), TCP with large windows (TCP-LW), a congestion prediction protocol such as the TCP-Vegas protocol, and a TCP spoofing protocol. In other embodiments, any type and form of user datagram protocol (UDP), such as UDP over IP, may be used.

Figure 15:
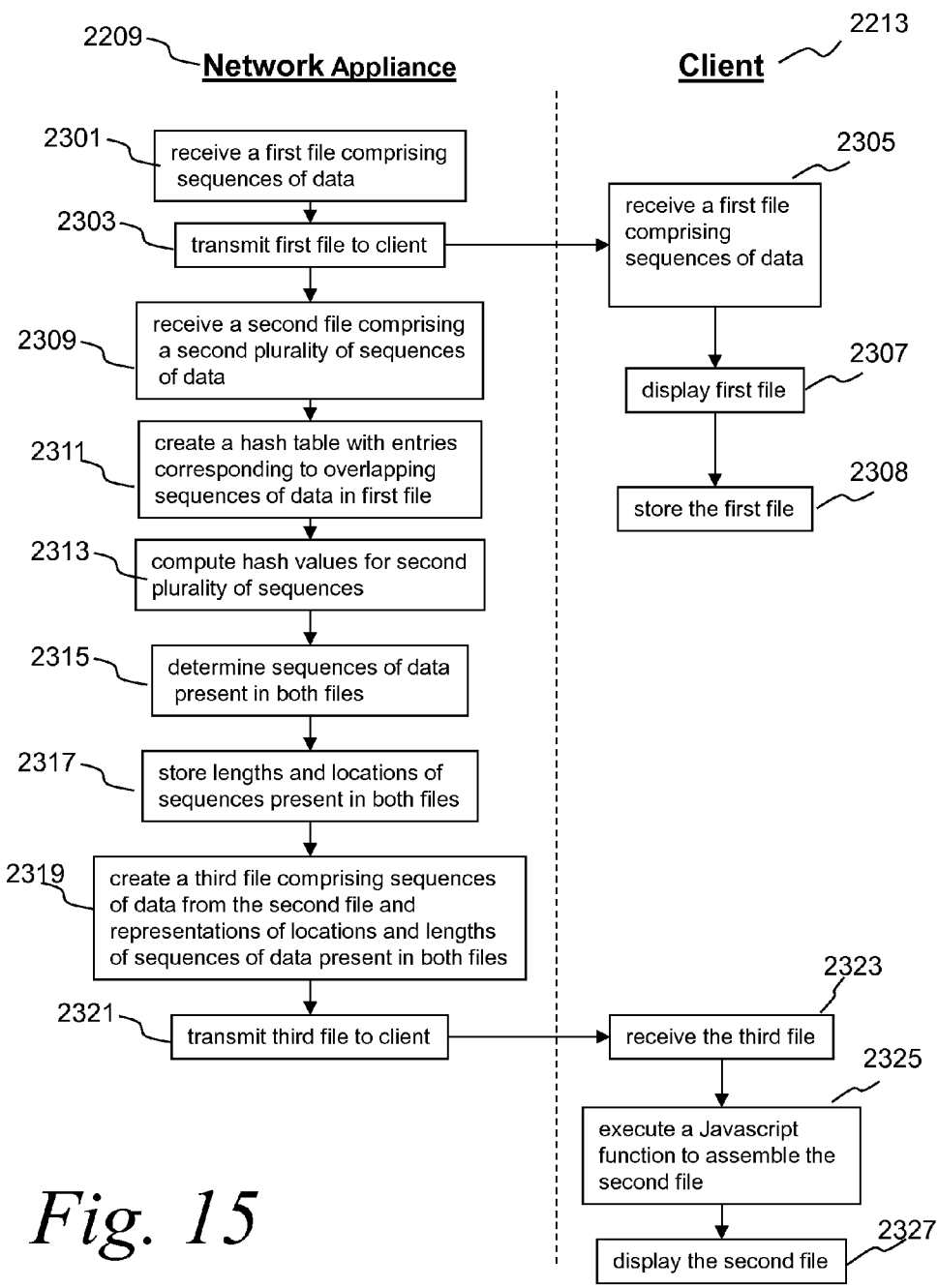
FIG. 15 is a flow diagram depicting one embodiment of a method for creating an efficient update to a previously stored file.

Referring now to FIG. 15, one embodiment of a method for creating an efficient update to a previously stored file is shown. Although FIG. 15 depicts the method in the context of being performed by a network appliance 2209 and a client 2213, the method may be performed by any of the computing devices discussed herein either alone or in any combination. In brief overview, the method comprises: receiving a first file comprising a first plurality of sequences of data (step 2301); transmitting the first file to a client (step 2303); receiving a second file comprising a second plurality of sequences of data (step 2309); creating a hash table having a plurality of entries, each of the plurality of entries corresponding to a respective one of the first plurality of sequences, and wherein at least two of said entries correspond to overlapping sequences of data (step 2311); computing hash values for said second plurality of sequences of data (step 2313); comparing each of the second plurality of sequences of data with sequences from the first plurality of sequences having the same hash value to determine sequences of data present in both files (step 2315); storing representations of lengths and locations of said sequences of data present in both the first and second files (step 2317); creating a third file comprising sequences of data from the second file and representations of locations and lengths of said sequences of data present in both the first and second files (step 2319); and transmitting the third file to a client (step 2321).

Still referring to FIG. 15, and now in greater detail, the network appliance 2209 receives a first file comprising a first plurality of sequences of data (step 2301). In some embodiments the first file may be received from a network 2211', from a server 2205, from a database, or from any combination thereof. In some embodiments the first file may be read from a disk or other storage medium, retrieved from a cache, or accessed from RAM. In other embodiments the first file may be received from an application or process executing on the network appliance 2209.

The first file may comprise sequences of data corresponding to sequences of bits or bytes comprising the file. The first file may comprise any file protocol, including without limitation, HTML, XML, WML, SVG, other document protocols, image file protocols, sound file protocols, video file protocols, and binary file protocols. In some embodiments the file comprises a web page or a portion of a web page. In some embodiments the file comprises any web page that is updated with some frequency, including without limitation a news page, a web application page, a chat room, a bulletin board, a sports page, an e-mail page, a directory listing, a tracking page, and a webcam page. After receiving the first file, the network appliance 2209 may store or cache the first file to permit later retrieval. In some embodiments the network appliance 2209 may modify said first file in accordance with any of the network appliance functions described herein.

In some embodiments, after receiving the first file (step 2301), the network appliance 2209 transmits the first file to a client (step 2303). The network appliance 2209 may transmit the first file via any of the networks, or protocols described herein, and to any of the clients described herein. The network appliance 2209 may modify the first file in accordance with any of the functions performed by the network appliance, including compression, acceleration and encryption. Although FIG. 15 depicts the network appliance 2209 transmitting the first file immediately after step 2301, in other embodiments said transmittal could occur after any of the steps (steps 2305-2321) occurring after the network appliance 2209 receives the first file (step 2301).

In some embodiments, the network appliance 2209 may store a record of said transmission. Said record may be stored in any memory element, including a data base or cache. In one embodiment, the network appliance 2209 may access said cache to determine whether a given file has been previously transmitted to a client. In one embodiment, said records may be set to expire after a set amount of time. For example, if a network appliance 2209 has information indicating that a given client 2213 deletes all files from its cache at the end of each day, the network appliance may set all records of files transmitted to the client 2213 to expire at the end of each day.

In the embodiment shown, after the network appliance 2209 transmits the first file to the client 2213 (step 2303), the client may then receive the first file (step 2305), display the first file (step 2307), and store the first file (step 2308). The client may perform these steps in accordance with any of the embodiments described herein.

In the embodiment shown, after the network appliance 2209 transmits the first file to the client 2213 (step 2303), the network appliance receives a second file comprising a second plurality of sequences of data (step 2309). In other embodiments, the network appliance 2209 may receive the second file (step 2309) before or during the transmission of the first file to the client (step 2303). The second file may comprise any of the file types, protocols, web pages and portions of web pages discussed herein. After receiving the second file, the network appliance 2209 may store or cache the second file to permit later retrieval. In some embodiments the network appliance 2209 may modify said second file in accordance with any of the network appliance functions described herein.

After receiving the second file comprising a second plurality of sequences of data (step 2309), the network appliance may create a hash table having a plurality of entries, each of the plurality of entries corresponding to a respective one of the first plurality of sequences, and wherein at least two of said entries correspond to overlapping sequences of data (step 2311). Said hash table may be created according to any known hash table algorithm which provides functionality to store sequences of data or references to sequences of data as entries and then efficiently search said table for entries matching a given sequence. In other embodiments, the network appliance may create the hash table (step 2311) before or during receiving the second file (step 2309).

In some embodiments, the entries in the hash table may correspond to sequences of data from the first file comprising sequences of bytes. The sequences of bytes may be of any length. In one embodiment the sequences are four-byte sequences.

In the embodiment shown, at least two of the hash table entries correspond to overlapping sequences of data. Overlapping sequences may have any number of bytes in common. For example if the file comprised the sequence "abcdefghijklmnop", examples of overlapping four-byte sequences include "cdef" and "defg" in addition to "cdef" and "fghi." In one embodiment, the hash table entries correspond to successive overlapping byte sequences. For example, if the file comprised the sequence "abcdefg", a hash table comprising at least two successive overlapping four-byte sequences may include entries corresponding to the sequences "abcd" "bcde" "cdef" and "defg".

In some embodiments, the hash table entries at a given time may only correspond to sequences of data from a given portion or "window" of the first file. This allows the size of the hash table to be smaller than the hash table might be if the entire file was hashed at once. In some embodiments, only the first X bytes of the first file are hashed, and then, upon occurrence of some conditions, Y entries are removed from the table followed by Y more entries being added to the table. In one embodiment a window size of 64 kilobytes is used, and upon occurrence of certain conditions, the window is moved by 32 kilobytes. In this embodiment, the sequences from the first 64 kilobytes of the first file are hashed, and then upon occurrence of certain conditions, the entries corresponding sequences from the first 32 kilobytes of the file are removed, and entries corresponding to sequences from the next 32 kilobytes of the file are added.

The conditions upon which the hash window are moved may be any conditions which improve the execution time, performance, or compression of the hashing algorithm. In one embodiment, the window is moved when matches have been found for more than 85% of the sequences in a given half of the window. In another embodiment, the window is moved when a given percentage of the second file has been compared with the existing hash entries. In one embodiment, the window is moved when hash values have been computed and compared for a proportionate portion of the second file compared to the first file. For example, if the first file is 100 kilobytes, and the second file is 80 kilobytes, the hash window may be moved when 80/100*64 kilobytes of the second file has been compared to sequences in the hash table.

After the network appliance 2209 creates a hash table (step 2311), the network appliance 2209 may then compute hash values for said second plurality of sequences of data (step 2313). Said hash values may be computed according to the same method used to compute hash values for the first plurality of sequences. The network appliance 2209 may choose sequences of data from the second file in the same manner in which the network appliance chose sequences of data from the first file. For example, if the network appliance 2209 created hash table entries corresponding to successive overlapping four-byte sequences from the first file, the network appliance may choose to compute hash values for successive overlapping four-byte sequences from the second file.

After computing hash values for some or all of the second plurality of sequences of data (step 2313) the network appliance 2209 may compare each of the second plurality of sequences of data with sequences from the first plurality of sequences having the same hash value to determine sequences of data present in both files (step 2315). The network appliance may perform this step in accordance with any hashing algorithm presently available. Said comparisons may comprise a comparison of subsequent bytes of matched sequences to determine longer matches. For example, the first file may comprise the sequence "abcdefghijklmno" and the second file may comprise the sequence "zyxwvutcdefghituv." If the hashing is done on successive four-byte sequences, the network appliance 2209 may determine that the sequence "cdef" is present in both files. The network appliance 2209 may then compare subsequent bytes of the matched sequences to determine that the sequence "cdefghi" is present in both files. Thus in some embodiments the lengths of the sequences determined to be present in both files may vary from the lengths of the sequences for which hash values are computed. In some embodiments a minimum and maximum length on matching sequences may be set.

After determining sequences of data present in both files (step 2315) the network appliance 2209 may store representations of lengths and locations of said sequences of data present in both the first and second files (step 2317). The network appliance 2209 may store said representations in any storage medium, including a cache, RAM, a disk, or tape. In some embodiments, the network appliance 2209 may store said representations on the network appliance 2209 itself. In other embodiments, the network appliance 2209 may store said representations on another computing device 2100. In some embodiments, lengths and locations of a sequences of data may be stored while the network appliance 2209 is comparing each of the second plurality of sequences of data with sequences from the first plurality of sequences having the same hash value (step 2313). In other embodiments a minimum length may be required for the length and location of a given sequence to be stored. In one embodiment, the minimum length may be specified to be four bytes.

The representations of lengths and locations of said sequences present in both files may comprise any representation which identifies a length and location of a sequence. In some embodiments the locations of said sequences are stored as absolute locations within a file. In other embodiments, the locations of said sequences are stored as locations relative to a given reference pointer within said first file. In one embodiment, said reference pointer may be fixed, in another embodiment said reference pointer may move according to a rule set.

In one embodiment the reference pointer may be initially set to point to the beginning of the first file. The pointer may then be incremented every time a matching sequence of longer than 5 bytes is found. The pointer may then be incremented to point to the last byte plus one of the matching sequence in the first file. In this embodiment, locations of said sequences present in both files are stored as a given number bytes, positive or negative, from the position of the reference pointer.

In some embodiments, the lengths and locations of the matched sequences are stored as fixed length integers. In one embodiment, the length of a matched sequence is stored as a 1 byte integer, wherein the integer represents a length of between 4 to 1027 bytes. In this embodiment, byte-lengths of matched sequences are restricted to multiples of 4. In other embodiments, any other bit or byte length integers may be used to store said sequence lengths. In still other embodiments, any other restrictions may be imposed on byte-lengths of matched sequences, including minimum and maximum lengths, and limiting byte lengths to given multiples. In still other embodiments, lengths of matched sequences may be stored as variable length integers. In some embodiments locations of matched sequences may be stored as variable length integers. In other embodiments, locations of matched sequences are stored as fixed length integers of a given byte or bit length.

After the network appliance 2209 stores representations of lengths and locations of said sequences of data present in both the first and second files (step 2317), the network appliance 2209 may create a third file comprising sequences of data from the second file and representations of locations and lengths of said sequences of data present in both the first and second files. Said creation (step 2317) may occur after all the lengths and locations of matched sequences are stored, or said creation (2317) may occur contemporaneously as matched sequences are found. The third file may contain representations of lengths and locations in any format discussed herein. In some embodiments lengths and locations of shared sequences may be preceded by special byte or bit sequences.

For example, if a first file comprised the string "abcdefghijklmnop," and the second file comprised the string "xxxxxxxdefghijkxxxxxxcdefxxx", the third file may comprise the sequence "xxxxxxx3,8xxxxxx2,4xxx". In this example 3,8 is used to indicate a representation indicating the sequence from the first file starting at byte 3 and 8 bytes long (in some embodiments this representation could be two fixed-length binary integers). Likewise 2,4 indicates that a representation indicating the sequence from the first file starting at byte 2 and 4 bytes long.

As another example, if the first file comprised the string "abcdefghijklmnop," and the second file comprised the string "xxxxxxxdefghijkxxxxxxcdefxxx", the third file may comprise the sequence "xxxxxxx3,8xxxxxx-9,4xxx". In this example, locations of shared sequences are stored as relative distances from a reference pointer, incremented according to the method described above. In this example, the network appliance 2209 indicates the first matched sequence in the same manner as the previous example, since the reference pointer initially points to the beginning of the first file. The reference pointer would then be incremented to point to location of the last byte plus one of the matching sequence in the first file. Thus, the second matched sequence is indicated with −9,4 which indicates that the second matched sequence occurs nine bytes prior to the byte following the previous matched sequence in the first file.

In one embodiment, the third file may be encoded in a byte protocol, such as ASCII. In one embodiment, each group of 7 bytes of binary data may be encoded as 8 bytes of ASCII characters. This conversion may be done by any known conversion method. The ASCII characters may correspond to any existing character set definition, including ISO-8859-1. In some embodiments, the third file may comprise an HTML file. In one embodiment, the third file may comprise a Javascript variable comprising said sequences of data from the second file and representations of locations and lengths of said sequences of data present in both the first and second files. In one embodiment, the third file may also comprise a Javascript function comprising functionality for assembling said second file by processing said Javascript variable. In another embodiment the third file may contain a reference to a Javascript function comprising said functionality.

The following HTML code illustrates one example of a third file that may be transmitted to a client.

```
<HTML>
  <HEAD>
    <SCRIPT>
       var updateFile = "~~~~ "
    <SCRIPT>
  </HEAD>
  <BODY onload=createPage( updateFile )>
  </BODY>
</HTML>
```

In the above example, an HTML file comprises a Javascript variable named "updateFile." Said variable may comprise sequences of data from the second file and representations of locations and lengths of said sequences of data present in both the first and second files. The example above also comprises a call to a Javascript function named "createPage." Said function, which may either be included with the HTML file or stored on the client, may comprise functionality for assembling said second file using the data from the Javascript variable "updateFile." In the example above, a standard HTML browser would execute the "createPage" function upon loading the HTML page. The "createPage" function may also comprise functionality for altering the HTML page to display said second file once the second file is assembled.

After creating a third file comprising sequences of data from the second file and representations of locations and lengths of said sequences of data present in both the first and second files (step 2319); and the network appliance 2209 may transmit the third file to a client (step 2321). Said transmission may occur via any of the networks and methods discussed herein. The network appliance 2209 may modify the third file in accordance with any function performed by the network appliance 2209 including compression, acceleration and encryption.

After transmitting the third file to a client (step 2321), the client 2213 may receive the third file (step 2323); execute a Javascript function to recreate the second file comprising sequences of data from the second file and sequences in the first file indicated by the third file (step 2325); and display the second file (step 2327). The client 2213 may perform these steps in accordance with any of the embodiments described herein.

Figure 16:
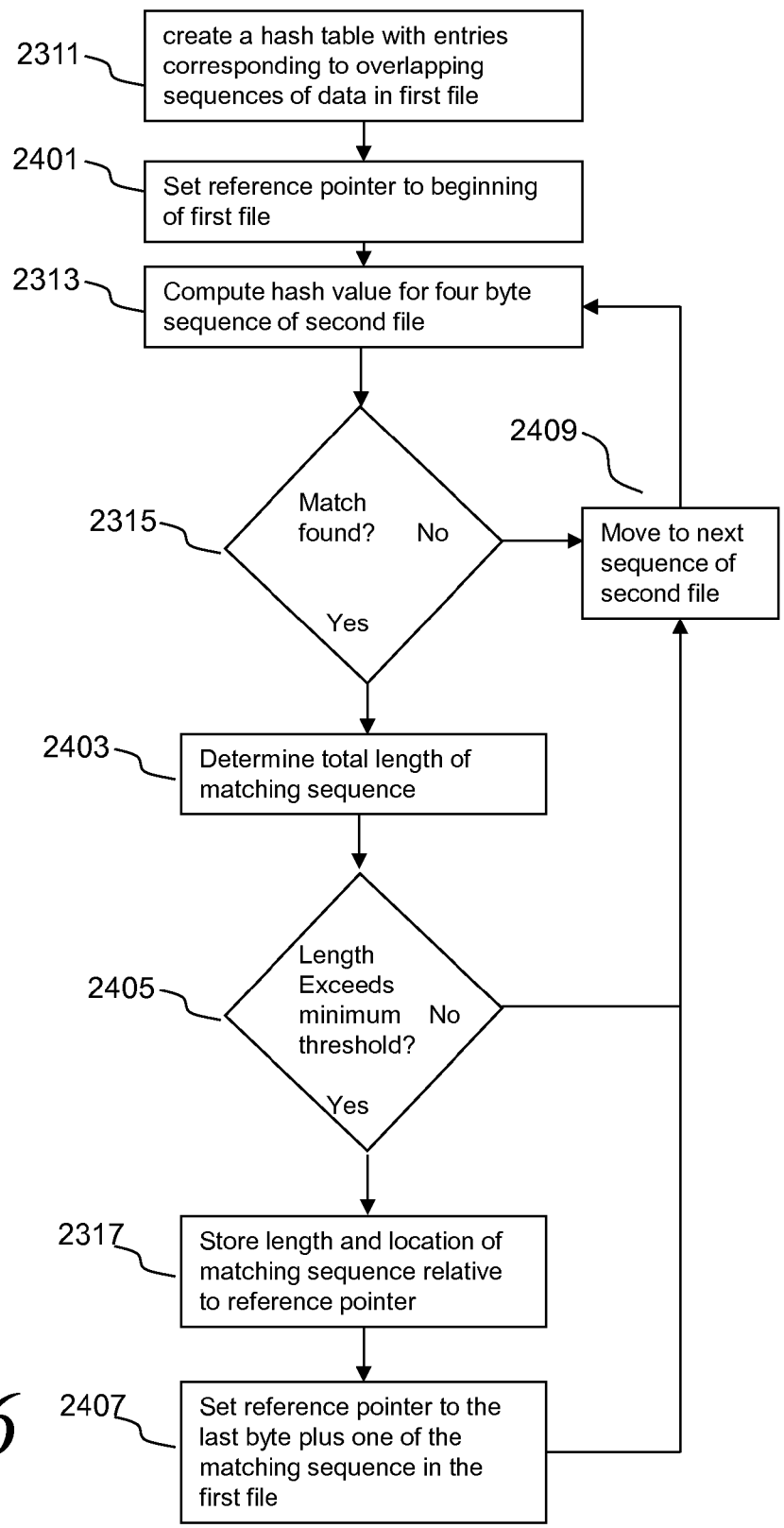
FIG. 16 is a flow diagram depicting another embodiment of a method for creating efficient updates to a previously stored file.

Referring now to FIG. 16, a flow diagram depicting another embodiment of a method for creating efficient updates to a previously stored file is shown. In brief overview, the method comprises creating a hash table with entries corresponding to overlapping sequences of data in a first file (step 2311); setting a reference pointer to the beginning of said first file (step 2401); computing a hash value for a sequence of data in a second file (step 2313); and determining whether said sequence is present in both files (step 2315). The method may then comprise either moving to the next sequence in the second file (step 2409) or determining a total length for the matching sequence (step 2403) and determining whether said length exceeds a minimum threshold (step 2405). The method may then comprise either moving to the next sequence in the second file (step 2409) or storing the length and location of the matching sequence relative to reference pointer (step 2317). The method may then comprise setting the reference pointer to the last byte plus one of the matching sequence in the first file (step 2407) and then moving to the next sequence in the second file (step 2409). In the embodiment shown, the method may be performed by a network appliance 2209.

Still referring to FIG. 16, now in greater detail, a network appliance 2209 creates a hash table with entries corresponding to overlapping sequences of data in a first file (step 2311). This step may be performed in accordance with any of the methods for creating a hash table described herein.

After creating a hash table with entries corresponding to overlapping sequences of data in a first file (step 2311) the network appliance 2209 may set a reference pointer to the beginning of said first file (step 2401). The reference pointer may comprise any type of pointer.

After setting a reference pointer to the beginning of said first file (step 2401), the network appliance 2209 may compute a hash value for a sequence of data in a second file (step 2313). This step may be performed in accordance with any of the methods for computing a hash value described herein.

After computing a hash value for a sequence of data in a second file (step 2313), the network appliance 2209 may determine whether said sequence is present in both files (step 2315). This step may be performed in accordance with any of the methods described herein.

If a sequence is not present in both files, the network appliance 2209 may move to the next sequence of the second file (2409). Said next sequence may comprise any sequence occurring after the given sequence in the second file. In one embodiment, the next sequence may be the sequence starting one byte after the previous sequence. In another embodiment, the next sequence may be the sequence starting any other number of bytes after the previous sequence. In some embodiments moving to the next sequence of the second file (step 2409) may be accompanied by moving a hash window as described previously herein. If no next sequence exists, the method may terminate.

If a sequence is present in both files, the network appliance 2209 may determine a total length of a matching sequence by comparing subsequent bytes of the matched sequences (step 2403). The total length may be determined in accordance with any of the methods described herein.

The network appliance 2209 may then determine if the total length of the matching sequence exceeds a given threshold (step 2405). This determination may be made in accordance with any of the methods described herein. If the length of the matching sequence does not exceed the minimum threshold, the network appliance 2209 may move to the next sequence of the second file.

If the length does exceed the minimum threshold, the network appliance 2209 may then store the length and location of the matching sequence relative to the given reference pointer in accordance with any of the methods discussed herein. The network appliance 2209 may then increment the reference pointer according to any of the methods described herein (step 2407). The network appliance 2209 may then move to the next sequence of the second file (step 2409).

Figure 17:
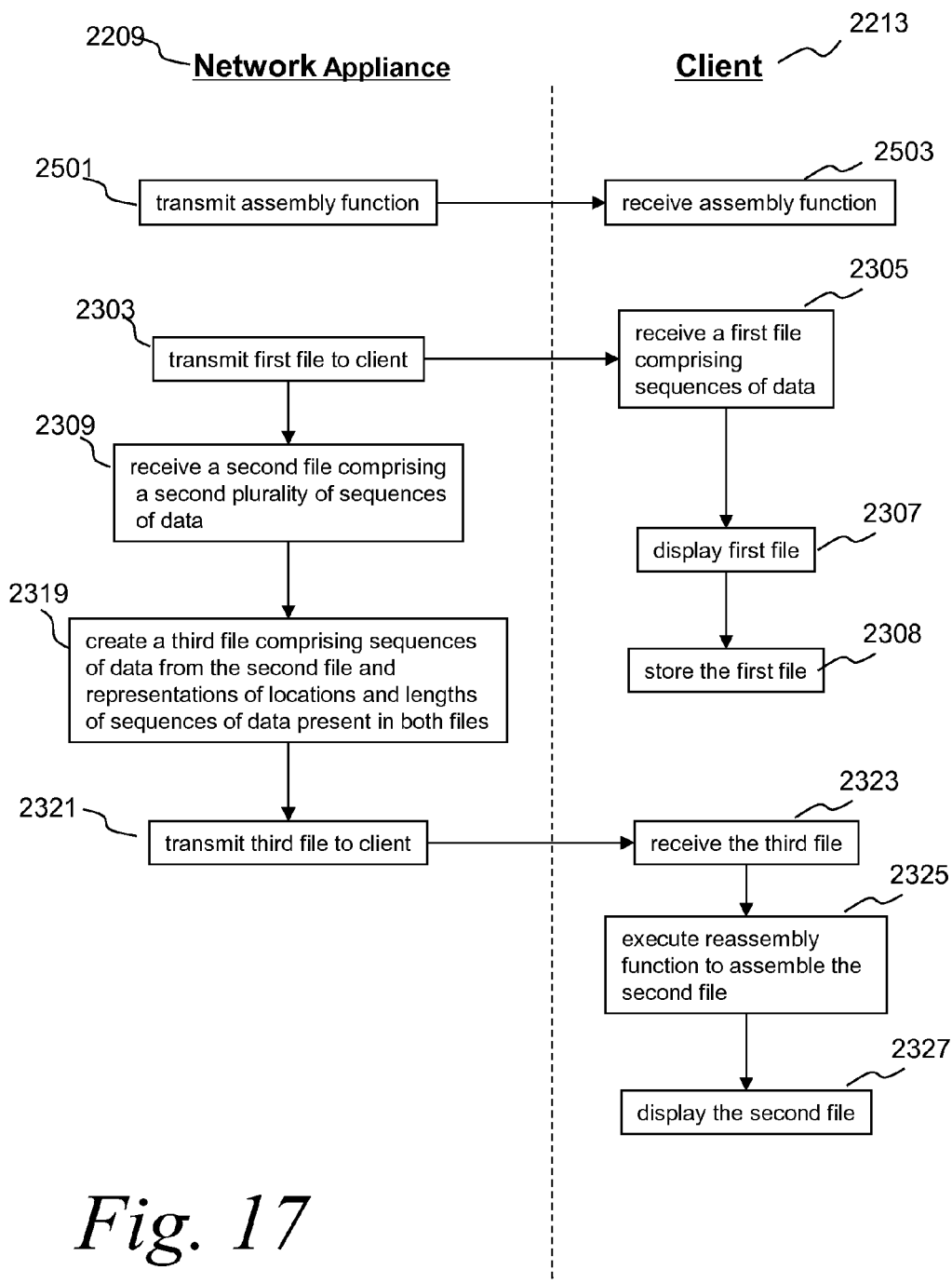
FIG. 17 is a flow diagram depicting another embodiment of methods for creating and receiving efficient updates to a previously stored file.

Now referring to FIG. 17, one embodiment of a method for efficiently receiving updates to previously stored files is depicted. In brief overview, said method comprises: receiving an assembly function (step 2503), receiving a first file comprising sequences of data (step 2305); displaying said first file; storing said first file (step 2308); receiving a third file comprising sequences of data and representations of locations and lengths of sequences in the first file (step 2323); executing a Javascript function to create a second file comprising sequences of data from the second file and sequences in the first file indicated by the third file (step 2325); and displaying said second file (step 2327).

Still referring to FIG. 17, now in greater detail, a network appliance 2209 may transmit an assembly function. Said assembly function may comprise any computer readable program means for assembling a second file using a file comprising sequences of data from a second file and representations of locations and lengths of said sequences of data present in both a first and second files. Said assembly function may comprise any programming or scripting language, including Javascript, or Java. In some embodiments, the assembly function may be transmitted in accordance with any of the other network appliance functions described herein. In one embodiment, the assembly function may be included in a program providing other client-side acceleration functionality.

In the embodiment shown, after the network appliance 2209 transmits an assembly function (step 2501), a client 2213 receives the assembly function (step 2503). The client may receive said assembly function via any of the networks, protocols, or computing devices described herein. In some embodiments, the client 2213 receives the assembly function from a network appliance 2209. In one embodiment, the assembly function may be included as part of a client-side acceleration program. In other embodiments, the assembly function may be installed on the client 2213 via any means of transferring software, including via a disk or other portable storage device.

In the embodiment shown, after receiving a assembly function (step 2503), the client 2213 receives a first file comprising sequences of data. In the embodiment shown, the client 2213 receives the first file from a network appliance 2209. In other embodiments, the client 2213 may receive the first file from any computing device. Said file may comprise any file type or protocol discussed herein.

After a client 2213 receives a first file comprising sequences of data (step 2305), the client 2213 may display said first file (step 2307). The file may be displayed in any manner appropriate for the given file. In some embodiments, the file may be displayed in a web browser. In other embodiments, the file may be displayed in a business application, such as a word processor or a spreadsheet. In still other embodiments the file may comprise a standalone application and be displayed as such. In some embodiments, the file may correspond to an application running in a virtual computing environment. In one embodiment, the file may correspond to a remotely executing application. In another embodiment, the file may correspond to a streaming application.

After a client 2213 displays said first file (step 2307), the client 2213 may store said first file (step 2308). The client 2213 may store the first file in any storage element, including storing in a cache, disk, flash memory, or RAM. In some embodiments, the client 2213 may compress the file for storage. In other embodiments the client 2213 may store only portions of the file. In some embodiments the client 2213 may store said first file (step 2308) before or during the display of said first file (step 2307).

After a client 2213 stores said first file (step 2308), the client 2213 may receive a third file (step 2323). In the embodiment shown, the client 2213 receives the third file from a network appliance 2209. In other embodiments, the client 2213 may receive the third file from any computing device. Said file may comprise any file type or protocol discussed herein. In some embodiments, the file may comprise ASCII characters. In other embodiments, the file may comprise binary data.

After a client 2213 receives said third file (step 2323), the client may execute a Javascript function to assemble a second file (step 2325). In some embodiments, the Javascript function may be included in said third file. In other embodiments, the Javascript function may be already stored on the client 2213. In some embodiments, the Javascript function may be provided in a client-side acceleration program. In some embodiments, the third file may comprise a link to a location where the client 2213 may download the Javascript function.

The Javascript function may perform any technique, or the reverse of any technique described herein to assemble said second file. In some embodiments, the Javascript function may comprise the assembly function received in step 2503. In other embodiments, the Javascript function may comprise a reference to said assembly function. In still other embodiments, said Javascript function may comprise means for downloading said assembly function.

After executing a Javascript function to assemble said second file (step 2325), the client may display said second file (step 2327). The file may be displayed in accordance with any of the methods described herein for displaying a file.

Figure 18:
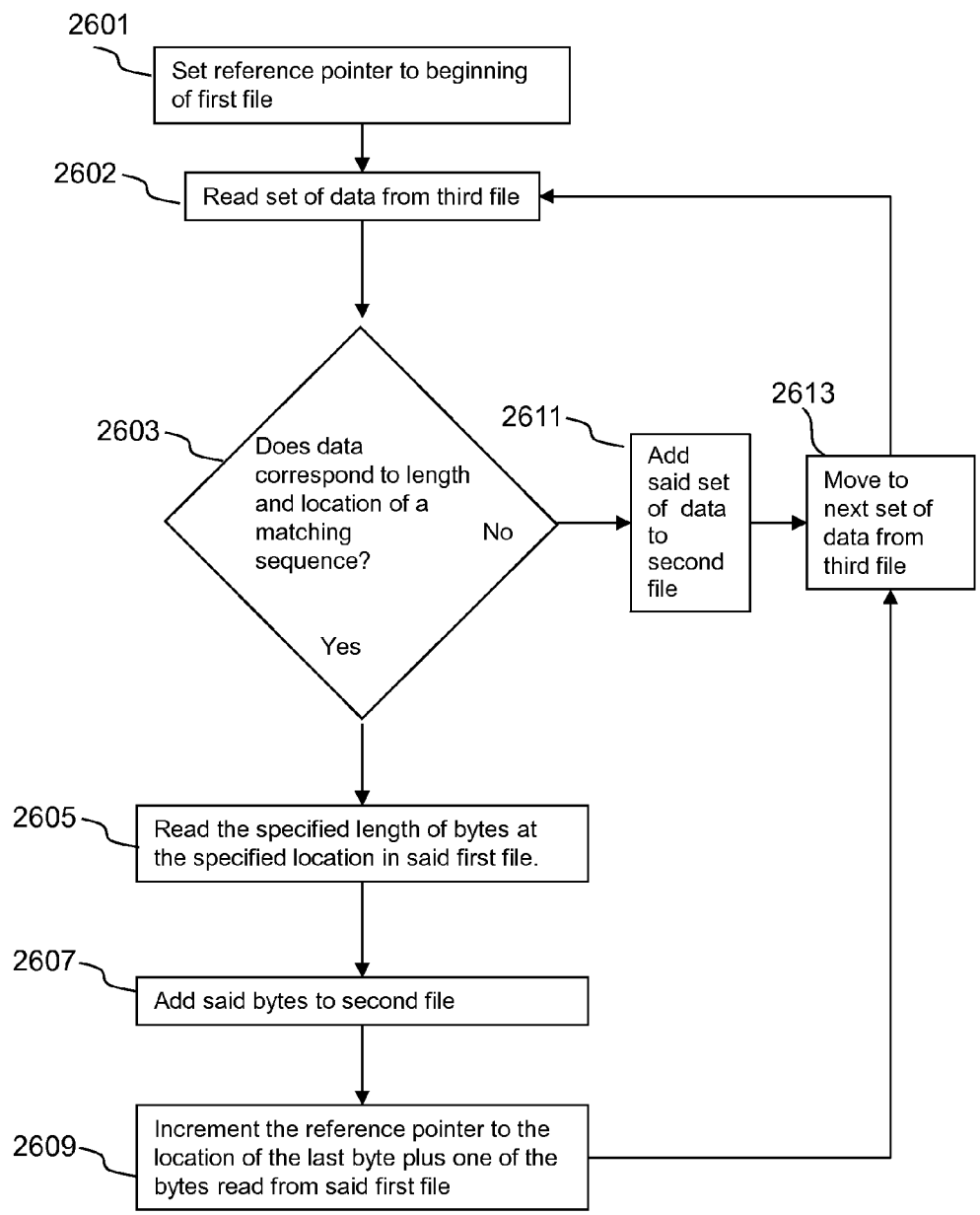
FIG. 18 is a flow diagram depicting one embodiment of a method for assembling a second file from a previously stored first file and a third file comprising sequences of data from the second file and representations of locations and lengths of sequences of data present in both the first and second files.

Referring now to FIG. 18, one embodiment of a method for assembling a second file from a previously stored first file and a third file comprising sequences of data from the second file and representations of locations and lengths of sequences of data present in both a first and second files is shown. In brief overview, the method comprises reading a set of data from a third file (step 2601) and determining whether said set of data corresponds to a locations and length of said sequences of data present in both the first and second files (step 2603). The method then may comprise reading the specified length of bytes at the specified location in said first file (step 2605); adding said bytes to the second file (step 2607); incrementing the reference pointer to the location of the last byte plus one of the bytes read from the first file (step 2609); and moving to the next set of data from said third file (step 2613). In one embodiment, said method may be performed by a client 2213. In another embodiment, said method may be performed by an assembly function as described in FIG. 17.

Still referring to FIG. 18, now in greater detail, a client 2213 may set a reference pointer to the beginning of the first file. This may be performed in accordance with any of the methods described herein.

After setting the reference pointer (step 2601) a client 2213 may read a set of data from a third file (step 2602). Said set of data may comprise any number of bits or bytes of said third file. In one embodiment, said set of data is then stored in a memory element or cache.

After reading said set of data (step 2602), a client 2213 may determine whether said set of data corresponds to a length and location of a sequence in the first file. In one embodiment, a client may determine whether said set of data comprises a special character or bit sequence.

If said set of data does not correspond to a length and location of a sequence in the first file, the client 2213 may add said set of data to the second file (step 2611). Said addition may comprise appending said set of data to the end of the second file. The client 2213 may then move to the next set of data from the third file (step 2613).

If said data does correspond to a length and location of a sequence in the first file, the client 2213 may then read the specified length of bytes at the specified location in the first file (step 2605). The client may determine the length and location specified by recognizing any of the representations of lengths and locations described herein. In one embodiment, the client may then store said specified bytes in a memory element or cache.

After reading the specified length of bytes at the specified location in the first file (step 2605), the client 2213 may then add said bytes to the second file (step 2607). Said addition may comprise appending said bytes to the end of the second file.

The client 2213 may then increment the reference pointer to the location of the last byte plus one of the bytes read from said first file (step 2609). This may be performed in accordance with any of the methods described herein. The client 2213 may then move to the next set of data from said third file. (step 2613).

Figure 19:
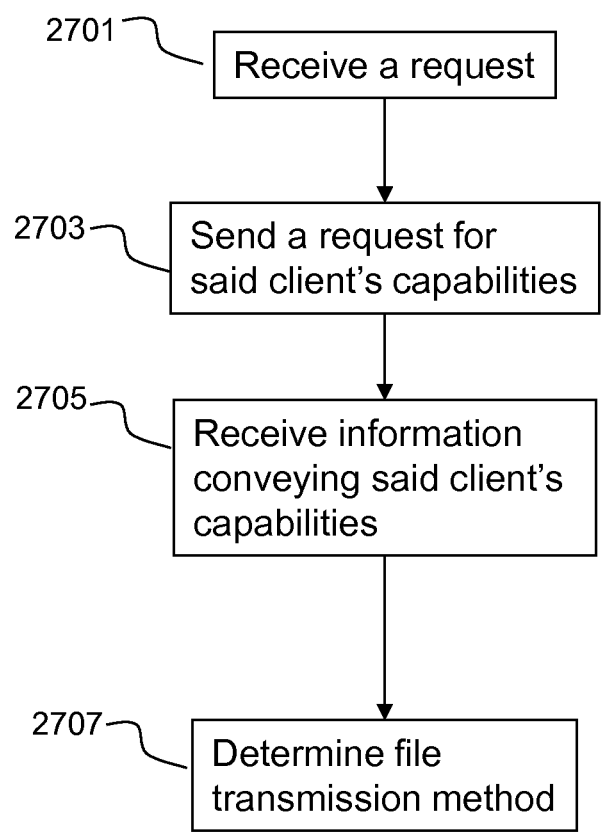
FIG. 19 is a flow diagram depicting one embodiment of a method for determining a file transmission method.

Referring now to FIG. 19, one embodiment of a method for determining a file transmission method is shown. Said method may be performed by any of the machines or combinations of machines described above, although the embodiment below describes the method being performed by a network appliance 2209. In brief overview, the method comprises receiving a request from a client 2213 for a resource (step 2701); sending a request for said client's capabilities (step 2703); receiving information conveying said client's capabilities (step 2705); and determining a file transmission method (step 2707).

Still referring to FIG. 19, now in greater detail, the network appliance 2209 receives a request from a client (step 2701). In one embodiment receiving a request from a client (step 2701) comprises receiving a request directly from a client. In other embodiments, the request from a client 2213 may be received from any of the networks, connections, and appliances previously discussed. Said request may comprise any of the protocols previously discussed. In some embodiments the request may comprise the request exactly as transmitted from the client 2213. In other embodiments the request may comprise a modification of an original request from a client 2213. Said modifications may comprise modifications in the course of providing any of the network appliance services discussed above, and any other modifications to the content, format, protocol, addressing, headers, or other portions of the request. request from a client 2213, or a new request. A request may comprise a resource directly requested by a client 2213, and it may comprise a resource requested in the course of performing any service for the client 2213.

After receiving a request from a client (step 2701), the network appliance 2209 sends a request for said client's capabilities (step 2703). In one embodiment, said request may be sent to the client 2213. In another embodiment, request may be sent to a collection agent as described in U.S. patent application Ser. No. 10/956,832 "A METHOD AND APPARATUS FOR ASSIGNING ACCESS CONTROL LEVELS IN PROVIDING ACCESS TO NETWORKED CONTENT FILES" whose contents are expressly incorporated herein by reference. Said collection agent may reside on the same physical machine as the network appliance sending the request, or they may reside on different physical machines. Said request may also be sent to a file, a cache, a database, a server, an executing application, or any other source of information concerning the client 2213.

After sending a request for the client's capabilities (step 2703) the network appliance 2209 receives information conveying said clients capabilities (step 2705). Said information may be received from a client 2213, a collection agent, a file, a cache, a database, a server, an executing application, or any other source of information concerning the client 2213. Said information may comprise, without limitation machine ID of a client node 2213, operating system type, existence of a patch to an operating system, MAC addresses of installed network cards, a digital watermark on the client device, membership in an Active Directory, existence of a virus scanner, existence of a personal firewall, an HTTP header, browser type, device type, network connection information, authorization credentials, and any of the other capabilities or preferences discussed above. In some embodiments, the network appliance may store or cache said information for later retrieval.

After receiving information conveying said clients capabilities (step 2705); the network appliance may determine a file transmission method corresponding to said client 2213 (step 2707). Said determination may be made on the basis of any of the information received.

In some embodiments, the network appliance 2209 may determine, in response to information received in step 2705, to transmit files in accordance with the method for creating efficient updates to a previously stored file described in FIG. 15. In one embodiment, said determination may be made in response to information corresponding to the client's 2213 memory size, connection speed, connection bandwidth, processor speed, or the prior existence of a stored file.

In some embodiments, the network appliance 2209 may determine, in response to information received in step 2705, to transmit an assembly function to the client 2213. For example, the network appliance may transmit an assembly function to a client 2213 if the network appliance 2209 receives information that the client 2213 does not possess the assembly function, and the information indicates the client has the capability to execute a assembly function. In some embodiments, said assembly function may be transmitted along with any other files, including requested content files, or other files transmitted in accordance with the functions of the network appliance 2209. In some embodiments, a network appliance may possess a plurality of assembly functions. For example, a network appliance 2209 may possess a number of assembly functions optimized for different computing environments, operating systems, and hardware configurations. The network appliance may then determine, in response to the information received in step 2705, which assembly function to transmit to a client 2213.

As one skilled in the art appreciates and understands in view of the embodiments of the client, network appliance, gateway and servers described herein, any of these embodiments of the client, network appliance, gateway and servers may be configured and implemented to perform any combination of the methods described herein. For example, any of the embodiments of the methods described in connection with FIGS. 8, 9A-9B, 10, 11 and 12 may work in conjunction with, integrated with or be performed concurrently with any of the embodiments of the methods described in connection with FIGS. 15-19.

The methods disclosed herein may be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network.

In the preceding specification, the invention has been described with reference to specific exemplary embodiments. It will however, be evident that various modifications and changes may be made without departing from the broader spirit and scope of the invention as set forth in the claims that follow. The specification and drawings are accordingly to be regarded as illustrative rather than restrictive sense. Other embodiments of the invention may be apparent to those skilled in the art from consideration of the specification and practice of the invention disclosed herein.

What is claimed:

1. A method comprising:
(a) receiving, by a device intermediary to a plurality of clients and a server, a response from the server to a request for a web page by a client of the plurality of clients, the device storing a first file comprising a first plurality of sequences of data from a previous response served by the server;
(b) generating, by the device, an object list identifying object data within the response that is to be downloaded to the client;
(c) maintaining, by the device, a hash table having a plurality of entries, each of the plurality of entries corresponding to a respective one of a first plurality of sequences of data in the first file, and wherein at least two of the entries correspond to overlapping sequences of data;
(d) computing, by the device, hash values of a second plurality of sequences of data from the response for a second file;
(e) comparing, by the device, each of the second plurality of sequences of data with sequences from the first plurality of sequences having the same hash value to determine sequences of data present in both the first file and second file;
(f) creating, by the device, a third file comprising sequences of data from the second file, a first representation of a location and a length of a first sequence of data present in both the first file and second file and a second representation of a location and a length of a second sequence of data present in both the first file and the second file, the second representation of the location of the second sequence of data identifying a number of bytes between the first sequence of data and the second sequence of data in the first file, the first representation of the length of the first sequence of data identifying a number of matching bytes of the first sequence of data and the second representation of the length of the second sequence of data identifying a number of matching bytes of the second sequence of data; and
(g) transmitting, by the device, the third file and the object list to the client.

2. The method of claim 1, wherein (b) further comprises determining, by the device, whether each object data within the response is to be downloaded to a user agent of the client and generating the object list based on the determination.

3. The method of claim 1, further comprising receiving, by the device, request object data constructed by the client using the object list, the request object data comprising a request object list identifying object data and freshness data indicating that the object data is one of fresh or stale.

4. The method of claim 1, further comprising determining, by the device, whether object data within the response matches object data of the request object data.

5. The method of claim 4, further comprising indicating, by the device, that the object data is to be downloaded if the object data within the response does not match the object data of request object data.

6. The method of claim 4, further comprising determining, by the device, whether object data of the request object data is indicated by freshness data to be fresh or stale responsive to the object data within the response matching the object data of the request object data.

7. The method of claim 6, further comprising verifying with the server the request object data is fresh or stale if the request object data is indicated by the freshness data to be stale.

8. The method of claim 7, further comprising indicating that the object data is to be downloaded if the request object data is verified to be stale.

9. The method of claim 1, wherein (f) further comprises creating the third file comprising sequences of data from the second file and representations of locations and lengths of sequences present in both the first file and the second file, wherein the locations are represented as a relative distance from a location in the first file.

10. The method of claim 1, wherein (f) further comprises creating the third file comprising sequences of data from the second file and representations of locations and lengths of sequences present in both the first file and the second file, wherein the third file is translated into a byte sequence using a byte encoding protocol.

11. A system comprising:
a device intermediary to a plurality of clients and one or more servers, the device configured to receive a response from the server to a request for a web page by a client of the plurality of clients and configured to store a first file comprising a first plurality of sequences of data from a previous response served by the server;
a generator of the device configured to generate an object list identifying object data within the response that is to be downloaded to the client;
a hash engine of the device configured to maintain a hash table having a plurality of entries, each of the plurality of entries corresponding to a first plurality of sequences of data in the first file, and wherein at least two of the entries correspond to overlapping sequences of data;
wherein the hash engine is configured to compute hash values of a second plurality of sequences of data of the response for a second file;
wherein the device is configured to compare each of the second plurality of sequences of data with sequences from the first plurality of sequences having the same hash value to determine sequences of data present in both the first file and the second file; and create a third file comprising sequences of data from the second file, a first representation of a location and a length of a first sequence of data present in both the first file and second file and a second representation of a location and a length of a second sequence of data present in both the first file and the second file, the second representation of the location of the second sequence of data identifying a number of bytes between the first sequence of data and the second sequence of data in the first file, the first representation of the length of the first sequence of data identifying a number of matching bytes of the first sequence of data and the second representation of the length of the second sequence of data identifying a number of matching bytes of the second sequence of data; and
wherein the device is configured to transmit the third file and the object list to the client.

12. The system of claim 11, wherein the generator is further configured to determine whether each object data within the response is to be downloaded to a user agent of the client and generating the object list based on the determination.

13. The system of claim 11, wherein the device is further configured to receive request object data constructed by the client using the object list, the request object data comprising a request object list identifying object data and freshness data indicating that the object data is one of fresh or stale.

14. The system of claim 11, wherein the device is further configured to determine whether object data within the response matches object data of the request object data.

15. The system of claim 14, wherein the device is further configured to indicate that the object data is to be downloaded if the object data within the response does not match the object data of request object data.

16. The system of claim 14, wherein the device is further configured to determine whether object data of the request object data is indicated by freshness data to be fresh or stale responsive to the object data within the response matching the object data of the request object data.

17. The system of claim 16, wherein the device is further configured to verify with the server the request object data is fresh or stale if the request object data is indicated by the freshness data to be stale.

18. The system of claim 17, wherein the device is further configured to indicate that the object data is to be downloaded if the request object data is verified to be stale.

19. The system of claim 11, wherein the device is further configured to create the third file comprising sequences of data from the second file and representations of locations and lengths of sequences present in both the first file and the second file, wherein the locations are represented as a relative distance from a location in the first file.

20. The system of claim 11, wherein the device is further configured to create the third file comprising sequences of data from the second file and representations of locations and lengths of sequences present in both the first file and second the second file, wherein the third file is translated into a byte sequence using a byte encoding protocol.

* * * * *